(12) United States Patent
Anderson et al.

(10) Patent No.: US 7,912,660 B2
(45) Date of Patent: *Mar. 22, 2011

(54) SYSTEM AND METHOD FOR LOCATING AND ANALYZING ARCING PHENOMENA

(75) Inventors: Larry Anderson, Columbus, OH (US); John W. Beal, Delaware, OH (US); David S. Ellis, Hilliard, OH (US); John Lauletta, Hudson, OH (US)

(73) Assignee: Exacter, Inc., Columbus, OH (US)

( * ) Notice: Subject to any disclaimer, the term of this patent is extended or adjusted under 35 U.S.C. 154(b) by 84 days.

This patent is subject to a terminal disclaimer.

(21) Appl. No.: 12/495,988

(22) Filed: Jul. 1, 2009

(65) Prior Publication Data
US 2009/0265122 A1 Oct. 22, 2009

Related U.S. Application Data

(63) Continuation of application No. 11/881,939, filed on Jul. 30, 2007, now Pat. No. 7,577,535.

(60) Provisional application No. 60/905,424, filed on Mar. 7, 2007, provisional application No. 60/834,475, filed on Jul. 31, 2006.

(51) Int. Cl.
*G01R 21/00* (2006.01)
*G08B 21/00* (2006.01)

(52) U.S. Cl. ......... 702/62; 702/60; 702/61; 340/636.17; 340/646; 340/650; 340/870.07; 340/870.16; 362/531; 362/536

(58) Field of Classification Search ............... 702/60, 702/61, 62; 340/870.07, 870.16, 636.17, 340/646, 650; 362/531, 536
See application file for complete search history.

(56) References Cited

U.S. PATENT DOCUMENTS 6,092,027 A * 7/2000 Takai et al. ............... 702/38
6,822,457 B2 * 11/2004 Borchert et al. ........... 324/512
7,069,147 B2 * 6/2006 Manfred et al. ............. 702/2
2006/0271312 A1 * 11/2006 Hayes et al. ................ 702/60
2007/0156543 A1 * 7/2007 Klim et al. ................. 705/28

* cited by examiner

Primary Examiner — Eliseo Ramos Feliciano
Assistant Examiner — Janet L Suglo
(74) Attorney, Agent, or Firm — Mueller Smith & Okuley, LLC

(57) ABSTRACT

System and method for detecting partial discharge arcing phenomena in a power network distribution system which employs a mobile receiving assemblage including a wideband antenna, a computer controllable wideband radio receiver deriving an amplitude detected output and a global positioning system providing system position data. The amplitude detected outputs are digitized and treated with a digital signal processor based analysis including fast Fourier transforms extracting narrowband signal frequencies that are harmonically related to the network fundamental frequency. The narrowband signal frequencies are analyzed for peak amplitudes which are summed to derive maintenance merit values related to the arcing phenomena.

28 Claims, 20 Drawing Sheets

SYSTEM AND METHOD FOR LOCATING AND ANALYZING ARCING PHENOMENA

CROSS-REFERENCE TO RELATED APPLICATIONS

This application is a Continuation of application Ser. No. 11/881,939, filed on Jul. 30, 2007, and claims priority on Provisional application Nos. 60/905,424 filed Mar. 7, 2007, and 60/834,475, filed Jul. 31, 2006, the disclosures of which are expressly incorporated herein by reference.

STATEMENT REGARDING FEDERALLY SPONSORED RESEARCH

Not applicable.

BACKGROUND

Electric utilities represent the largest energy provider to consumers at the industrial, commercial and residential levels. The infrastructure to support the delivery of energy to the 131 million customers in the U.S. has been evolving over 100 years to what it is today. During this time, the distribution voltage level has become standardized at 69 kV, 34.5 kV, 17.2 kV, 12 kV, 7.2 kV, 4.7 kV, and 2.7 kV. These voltages are transformed to 480, 240, and 120 volts for use in machinery, systems, and homes.

The electrical distribution network can be compared to UPS van delivery service. UPS vans do not manufacture the products they deliver, nor do they carry them cross country. A UPS van is used to distribute packages at a local level.

The electrical distribution system or network connects to the electrical transmission system to deliver energy to the end-user. The transmission system connects to the generation system where electric energy is produced. Together, these three systems instantly deliver energy to all customers on demand. However, if the demand becomes too great or if the distribution system breaks down, there is no alternative way to deliver energy to end-users and a blackout or outage occurs.

The distribution system is different than the transmission system. The transmission system is easily noticed along highways and in the countryside. It includes imposing structures, long cross-country transmission lines, and power plants. Conversely, the distribution system is part of the urban landscape.

The distribution system or network is made up of 20- to 40-foot wooden or steel poles from which are suspended power lines or conductors, disconnect devices, lightning arrestors, capacitors, insulators, and a variety of pole line hardware elements, each of which plays a crucial role in keeping the lights on and factories running. This uptime of the electrical system or network is defined by one word: reliability.

The distribution system connects to the electric utility at a substation where transmission voltages are reduced to distribution levels. One transmission circuit delivers energy over many distribution circuits. A substation is like a UPS freight terminal where large cross-country trucks break down their loads to be picked up and delivered by smaller UPS vans. Power lines supported by power poles are referred to as overhead lines.

Due to deregulation in the 1990's, which segregated power generation from the distribution of electricity, maintenance of electric distribution systems is no longer fully included in a utility's rate base. This has resulted in a 50% reduction in electric distribution maintenance spending since 1990.

Electric utilities are largely regulated by state and federal entities that monitor pricing, consumer satisfaction, and reliability. The state PUCs are tasked with the regulation of pricing and customer reviews of the electric utility as a monopolistic supplier of energy. The PUC has the right and ability to deny a utility the right to increase the charge for energy to a class of customers based upon public hearings and customer review. A recent rate hike for a major power company was denied in April of 2006 because according to the PUC of Ohio (PUCO) there was a "failure to maintain baseline performance levels of 75% of its distribution circuits." Baseline performance can be interpreted as keeping the lights on enough of the time to avoid customer complaints to the state PUC.

There are over three million miles of overhead and underground electrical distribution circuits in the U.S. that provide consumers access to electrical energy. Ninety percent of all interruptions to electrical service occur when elements of the distribution system break down.

In this report, particular attention is paid to the electrical distribution network as an aging infrastructure that is being continuously strained without the appropriate level of attention and rehabilitation. See: www.energetics.com/gridworks/grid.html, Department of Energy.

Decisions made by Public Utility Commissions (PUC) on the price a utility can charge for energy are often affected by the costs that consumers must bear for unreliable service. A study by the Department of Energy (DOE) in 2004 found that there is an annual $79 billion cost to consumers resulting from power outages.

Thirty-nine states have some form of punitive rate impact based upon customer satisfaction and the number of outages within a utilities service territory. These states each have mandatory outage reporting requirements and reliability measurement targets.

Some power failures like those due to natural disasters are unavoidable, but avoidable outages from failure of circuit elements or components make up 31% of all outages as measured by the National Energy Regulatory Commission (NERC).

In 2003, there were $2.4 billion in electric rate cases pending with PUC's. A rate case deferral or reduction of 54% or $1.3 billion was levied based upon service reliability and customer satisfaction issues.

Electric utilities in the U.S. experience an estimated 6 million outages each year related to electric distribution mechanical failures. This has resulted in a loss of $750 million annually to the utilities, in addition to failures to receive rate increases due to unsatisfactory reliability performance amounting to as much as $1.3 billion in 2003.

Thus, the electric utilities are dealing with the conflicting goals of delivering strong financial performance for investors while providing increasingly higher reliability performance for state utility regulators.

The distribution system is the delivery point for all utility customers, except the largest industrial customers such as steel mills and automotive manufacturing plants. Large industrial customers purchase energy on a wholesale basis at transmission voltage levels of 138 kV, 230 kV, 345 kV, 500 kV, or 765 kV. These wholesale customers include other utilities that buy and sell power on the wholesale market.

Power is the instantaneous measure of energy. Energy is power consumed over time and this is what small customers, like homes, purchase. Power is measured in thousands of watts or kilowatts (kW). Energy is how much power is used over time and is measured in thousands of watts per hour of use, or kilowatt-hours (kWh). At home we pay for energy by the kWh which averages about 10 cents per kWh. A typical home load may consume 1,000 kWh per month or about $100 of energy.

If a failure occurs in the distribution system, a customer looses electrical service. At the same time, the utility is impacted in several ways. First, it cannot sell energy to its customers. Second, customers immediately complain to the utility and the utility must react to these complaints. The utility must staff complaint lines, pay overtime to repair crews, locate problems and dispatch crews to the trouble area, purchase unplanned circuit elements to replace those that have failed, and explain to the Federal Energy Regulatory Commission (FERC) and the PUC why the problem occurred, what it is doing to avoid the problem reoccurring, and try to regain its customers' confidence through public relations and advertising.

A power outage or history of unreliable service also raises the issue of competition. In most states, electric customers have the opportunity to select who will provide them their energy. This has come about as part of the Energy Deregulation Act. This has set up fierce competition between the largest Investor-Owned Utilities (IOUs) like AEP, Con Ed and Duke Energy and 100 others; federal utilities including the Bonneville Power Administration (BPA), the Tennessee Valley Authority (TVA), and the Western Area Power Administration (WAPA); the Rural Electric Cooperatives (COOP) of which there are over 2,000; and the Municipal Electric Companies like the City of Columbus in Columbus, Ohio, of which there are thousands. Each of these entities must maintain customer loyalties or risk customer migration.

The distribution circuit or system is supported by a number of hardware elements. These elements maintain proper operation when they are all working. Age, vibration, weather, air pollution, lightning, and load all work against these elements causing them to loosen, crack, and fail. As these elements or components begin to fail, they emit high-frequency signals (EMI). These signals become pronounced as the element nears catastrophic failure or flashover. The result of a failure is an outage on the circuit feeding thousands of customers.

When an energized component fails, there is a telltale emission that results from electrical energy escaping from the circuit. This is much like a radio antenna, broadcasting the imminent failure. Devices have been designed that can report these emissions to expensive computer-based communication networks. The basic signature of failures is an arc which evidences an R.F. output exhibiting a very steep rise time followed by a decay. Important energy involved is one evoked from the rise time and not the decay. Looking to some component failures, with a broken distribution insulator, the electrical field surrounding the insulator begins to leak through the broken areas of it and sharp edges of the fracture emit these (EMI) signals that are detectable. The broken device becomes critical with a flashover of the insulator and an outage of the associated distribution circuit. Conductor brackets are designed to hold an energized conductor in place and maintain proper spacing from all other elements of the distribution system. If such a bracket fails, the conductor becomes loose and could swing into nearby structures of vegetation. If the conductor contacts any structure, tree or other path to ground, an outage occurs. Freeze-thaw cycles of weather may be a culprit in the causation of a loose conductor bracket. Conductors themselves may be partially broken from overload or other mechanical damage. The broken strands of the conductor limit the loads that can be supported before the conductor fails electrically. These strands may also serve as small antenna which emits specific signals.

The distribution circuit or system is a single path for the delivery of energy to homes, businesses, and industry. It begins at the step-down transformer at a substation. The step-down transformer reduces the voltage of the circuit from transmission levels to lower distribution voltages. An involved conductor or conductors in the entire network is energized to the distribution voltage level until the distribution transformer reduces the voltage once more to the appropriate low delivery voltage. A home usually receives a voltage of 120 volts line to neutral or 240 volts line to line.

If any of the hardware connecting, insulating, or protecting the distribution circuit or system fails, all of the loads downstream of the failure become affected. Sometimes a power outage occurs because there has been a problem such as a tree limb falling across a line or an animal causing an electrical fault by bridging across two conductors. However, equipment or component failure is the leading cause of circuit failure. When an equipment or component failure occurs, the broken element must be located and replaced.

Power failure can be a nuisance to the homeowner. Who hasn't had to reset their digital clocks following a power outage? But long-duration outages—those outages resulting from equipment failures—can cause serious damage particularly to a business which relies on electricity to operate.

A national survey of 411 small-business operators conducted in January 2004 by Decision Analysts for Emerson raises big questions about the ability of small companies to withstand a lengthy power outage. The survey, which is accurate to plus or minus five percentage points, found that 80% of small businesses experienced an electrical porter outage in 2003. Further is was determined that 60% have no type of back-up power supply. Also, a Small Business Power Poll found that 75% of U.S. small businesses rate electrical power outages as only marginally less of a threat than competition (79%) and trauma from computer failure and a fire (77%). See:

Eckberg, John, "Power failures: Small companies, big losses," The Cincinnati Enquirer, Mar. 14, 2004.

Weather plays a significant role in electrical distribution equipment failure. When weather is inclement, a power outage is more than a nuisance. In this regard, many Canadian home-heating systems depend on electric power. Power lines and equipment can be damaged by freezing rain, select storms, high winds, etc. This damage can result in supply interruptions lasting from a few hours to several days. An extended power failure during winter months and subsequent loss of heat can result in cold, damp homes, severe living conditions, and damage to walls, floors and plumbing.

Litigation resulting from power failures is often a secondary effect. So much of the safety infrastructure on roadways, emergency alert systems, and life-support systems are dependent upon reliable energy.

Systems exist that address the concept of predictive circuit review, but these systems require the problems to become so bad that they are casually observed by customers. These are ultraviolet (UV) and infrared (IR) imagery of the circuit elements. UV cameras, such as those manufactured by OFIL of Israel, and IR cameras manufactured by FLIR, Inc., are available.

Existing monitoring products have a relatively high base cost and require technical skills, devoted labor, and post-analysis to be effective. The effectiveness of these methods relies on the opportunistic discovery of an already failing circuit element. There is no discovery survey associated with their use.

BRIEF SUMMARY

The present disclosure is addressed to system and method for locating and analyzing (e.g., partial discharge arcing phenomena), as may be encountered in electrical power distribution networks and the like. Those networks will perform at a given fundamental frequency which in the United States, for example, will be 60 Hz or 25 Hz with respect to Amtrack. The arc detecting approach incorporates one or more computer controllable wideband AM radio receivers having an arc signal amplitude detected output. That output is digitized to provide digital samples which are analyzed with a digital signal processor utilizing fast Fourier transforms to extract narrowband signal frequencies that are harmonically related to the fundamental frequency of the network under investigation. Such narrowband frequencies are further analyzed for peak amplitudes which are summed to derive maintenance merit values. A control computer is responsive to control the one or more radio receivers to locate the amplitude detected output and compile maintenance merit values with global positioning system data for submittal to storage. With the system, displays or maps of arcing phenomena may be published, the maintenance merit values giving an indication of the intensity and thus the criticality of arcing phenomena.

The system and approach is compact and does not require the intervention of a technician to operate within a given geographical area. In a preferred arrangement, the system is hardwired into the battery power supply and ignition switch function of a vehicle within which it rides. With such an arrangement, the system is turned on in conjunction with actuation of the vehicle ignition switch from an off position to an on position. When the vehicle completes a journey within the given geographical region and the ignition switch is turned off, the system will retain battery power supply until it uploads all collected data to a server or the like utilizing a cellular modem within a cell telephone system.

In one embodiment, the system employs two computer controllable wideband radio receivers, a first being dedicated to high frequency values of arcing phenomena and the second looking to lower frequency phenomena. The lower frequency based radio is computer adjusted based upon computed maintenance merit values, while the higher frequency dedicated radio is adjusted by adjusting a look-up table based upon the lower frequency maintenance merit values and radio frequency response.

In still another approach to the system, arcing phenomena characteristics are further analyzed utilizing a failure signature library storing analyzed arc data including fast Fourier transforms of digital sample, extracted narrowband signal frequencies harmonically related to the network fundamental frequency, peak amplitudes of such an analysis, a radio frequency spectrum of that analysis, an accept/reject signature event indicator, a signature part type, a signature part number and a manufacturer.

Other objects of the disclosure of embodiments will, in part, be obvious and will, in part, appear hereinafter.

The instant presentation, accordingly, comprises embodiments of the system and method possessing the construction, combination of elements, arrangement of parts and steps which are exemplified in the following detailed disclosure.

For a fuller understanding of the nature and objects herein involved, reference should be made to the

DETAILED DESCRIPTION OF THE INVENTION

A salient feature of the present method and system resides in its portability coupled with a capability of performing "on its own" without the manual intervention of a technician. This carries to the extent that when transported by a vehicle within a desired geographic region, it turns itself on in conjunction with operator actuation of a vehicle ignition switch to an on position and uploads its retrieved and treated arc differentiation and location data, for example, to an arc server when that switch is turned off. The vehicle operator may drive a random or pre-designated route within the subject geographic region. While somewhat technically complex, the convenience of the system is manifested by its high level of portability.

Figure 1:
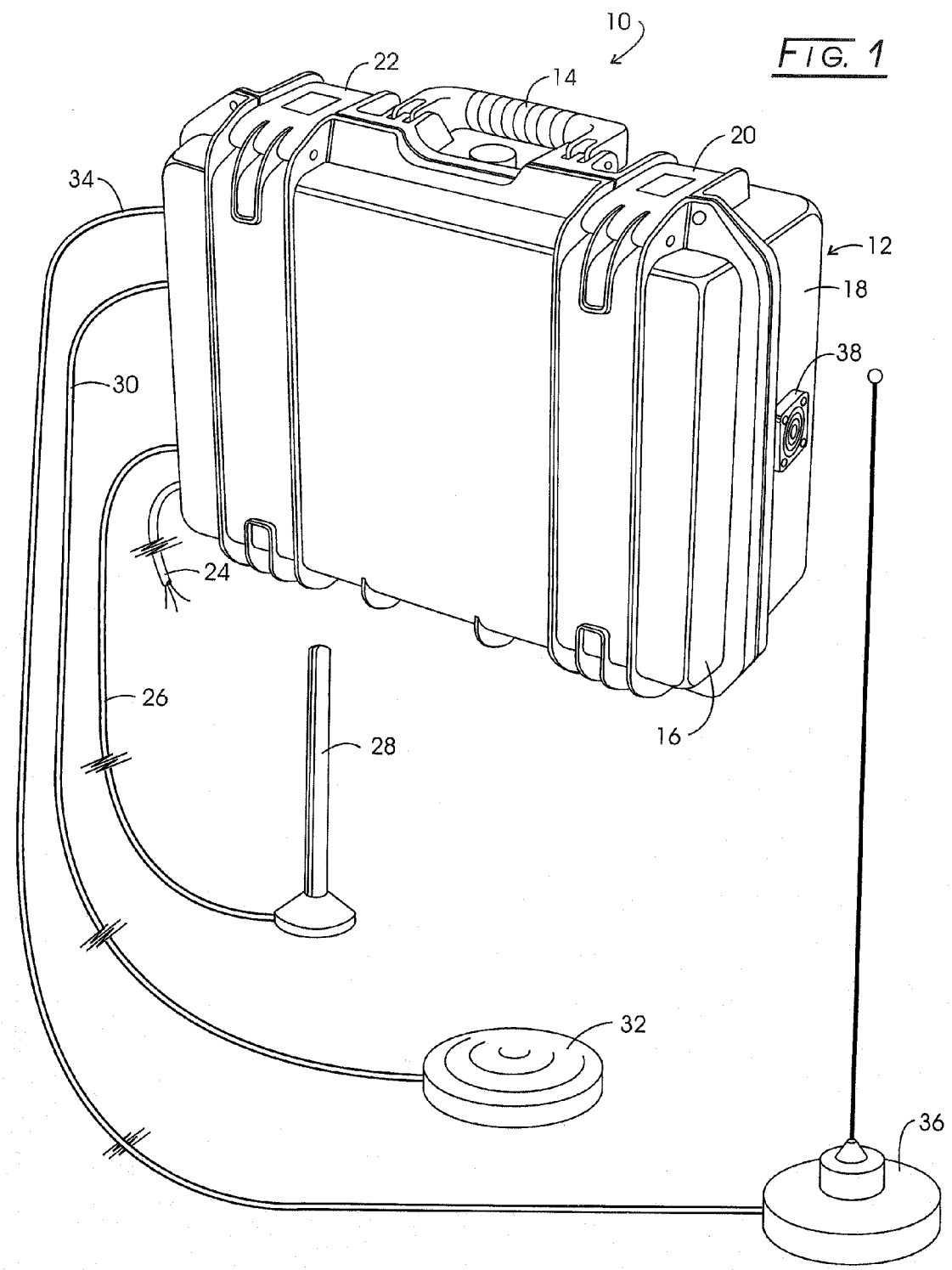
FIG. 1 is a perspective view of the instant system showing a carrying case in a closed orientation.

Looking to FIG. 1, such portability is made evident for the system as represented in general at 10. System 10 principally is concerned with a portable vehicle carried unit, the housing represented generally at 12 of which is a polymeric industrial carrying case with a handle 14, top and bottom components 16 and 18 which are mutually hinged together and retained in a closed orientation by over-center latches as at 20 and 22. Shown coupled to the housing 12 is a vehicle power input cable 24. Cable 24 preferably is hardwired into the vehicle, for example, at a fuse box. Adjacent cable 24 is cable 26 which extends to the systems cellular antenna 28. Antenna 28, for example, may be affixed to the cab roof of the vehicle by virtue of its magnetic base. Next adjacent cable 26 is a cable 30 extending from housing 12 to a global positioning system receiver arrangement 32 which also may be provided with a magnetic base for coupling to a vehicle roof. Finally, a cable 34 extends from housing 12 to a wideband radio antenna 36 which also may be provided with a magnetic base for purposes of vehicle roof mounting. Shown additionally at bottom component 18 of housing 12 is a fan vent 38.

Figure 2:
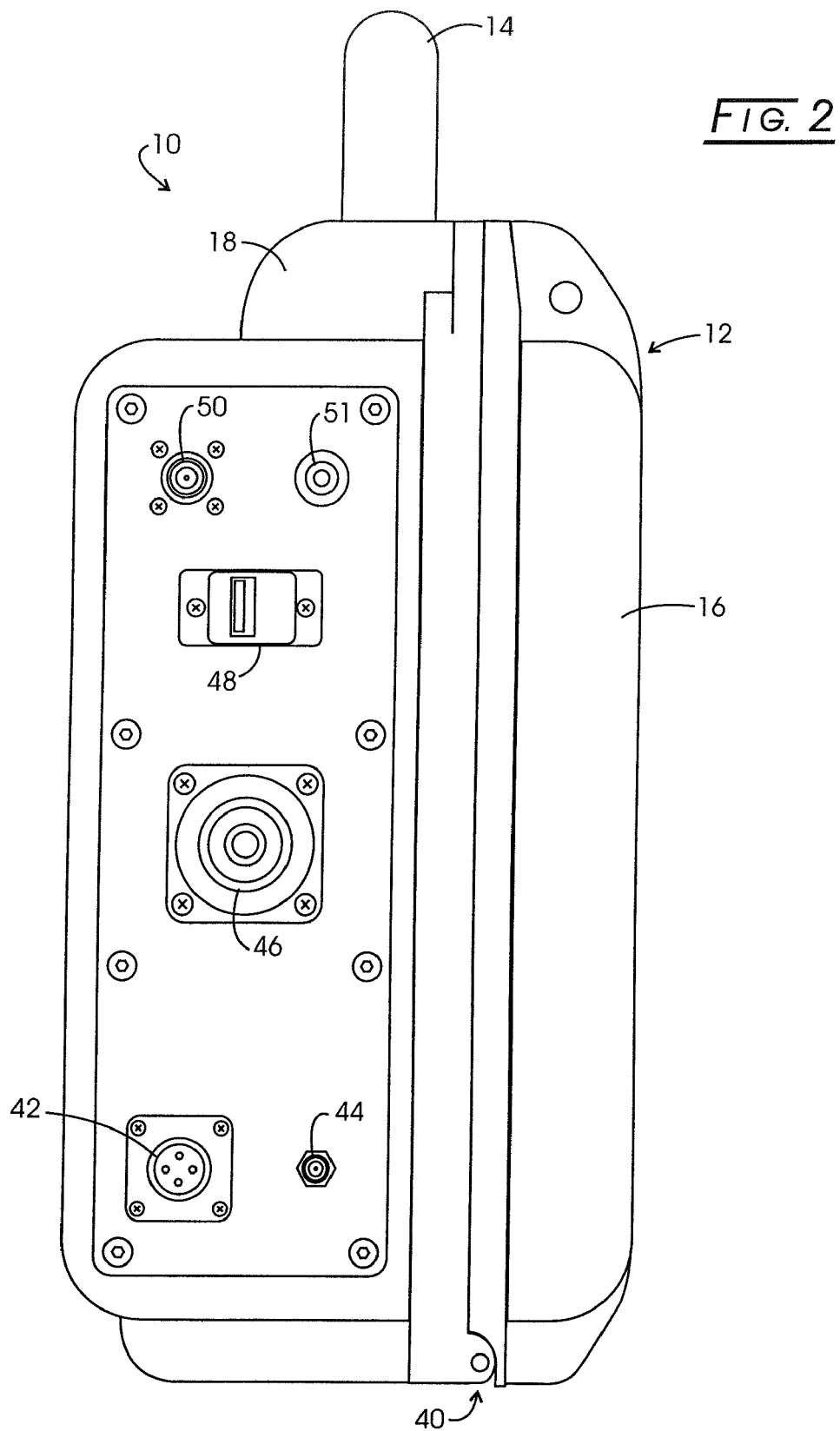
FIG. 2 is a side view of the carrying case shown in FIG. 1.

Looking momentarily to FIG. 2, the pivoting or hinged connection between components 16 and 18 is shown generally at 40. Above this connection 40 is a power input connector 42 which receives both switched power and battery power. Adjacent the connector 42 is a mobile antenna coupling 44. A cooling fan is provided at 46. Above cooling fan 46 is a global positioning system (GPS) connector 48 and above that connector is the coupling for a wideband radio receiver antenna 50. An audio out connector is shown at 51.

Figure 3:
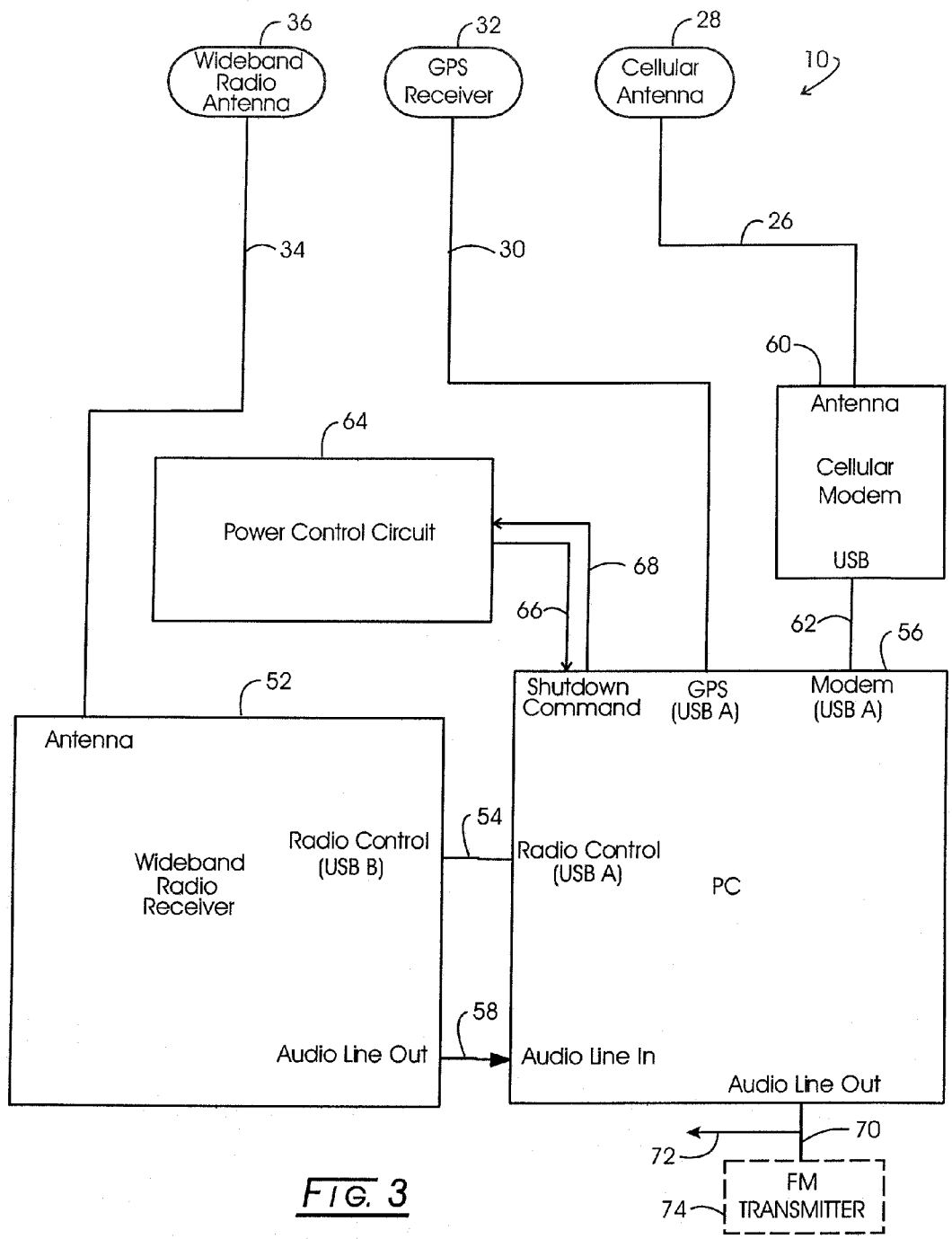
FIG. 3 is a block diagram of the present system.

Looking to FIG. 3, a broad block diagrammatic representation of system 10 is presented. In the figure, symbolically, wideband radio antenna 36 reappears along with GPS receiver 32 and cellular antenna 28. Cable 34, extending from antenna 36 again reappears as a line extending to the wideband antenna input of a wideband radio receiver represented in general at 52. Receiver 52 may be provided, for example, as a IC-PCR 1500 communications receiver marketed by Icom America, having a web location at http://www.icomamerica.com/product/receivers/per1500/specs.asp. Receiver 52 is controllable by computer as represented at line 54 extending from a control computer represented at block 56. Computer 56 may be provided as an Ampro Ready System™ 2 U Computer, marketed by Ampro Computers, Inc. of San Jose, Calif. Note that the audio output from wideband radio receiver 52 is represented at arrow 58 extending to control computer 56. Also extending to the control computer 56 is cable 30 of the GPS receiver identified earlier at 32. Adjacent to that input is the cellular antenna assemblage including antenna 28, cable 26 and a cellular modem represented at block 60. The association between cellular modem 60 and control computer 56 is represented at line 62. Cellular modem 60 may be a type MTCBA-C marketed by Multi-Tech Systems, Inc., of Mounds View Minn.

System 10 also incorporates a power control circuit represented generally at block 64. Circuit 64 is associated with control computer 56 by providing a shutdown command as represented at line 66 and being monitored by control computer 56 as represented at line 68. Finally, system 10 may incorporate an audio-out feature as represented at line 70, arrow 72 and dashed block 74 representing FM voice transmission for providing prompts and the like, particularly with respect to carrying out diagnostics.

Figure 4:
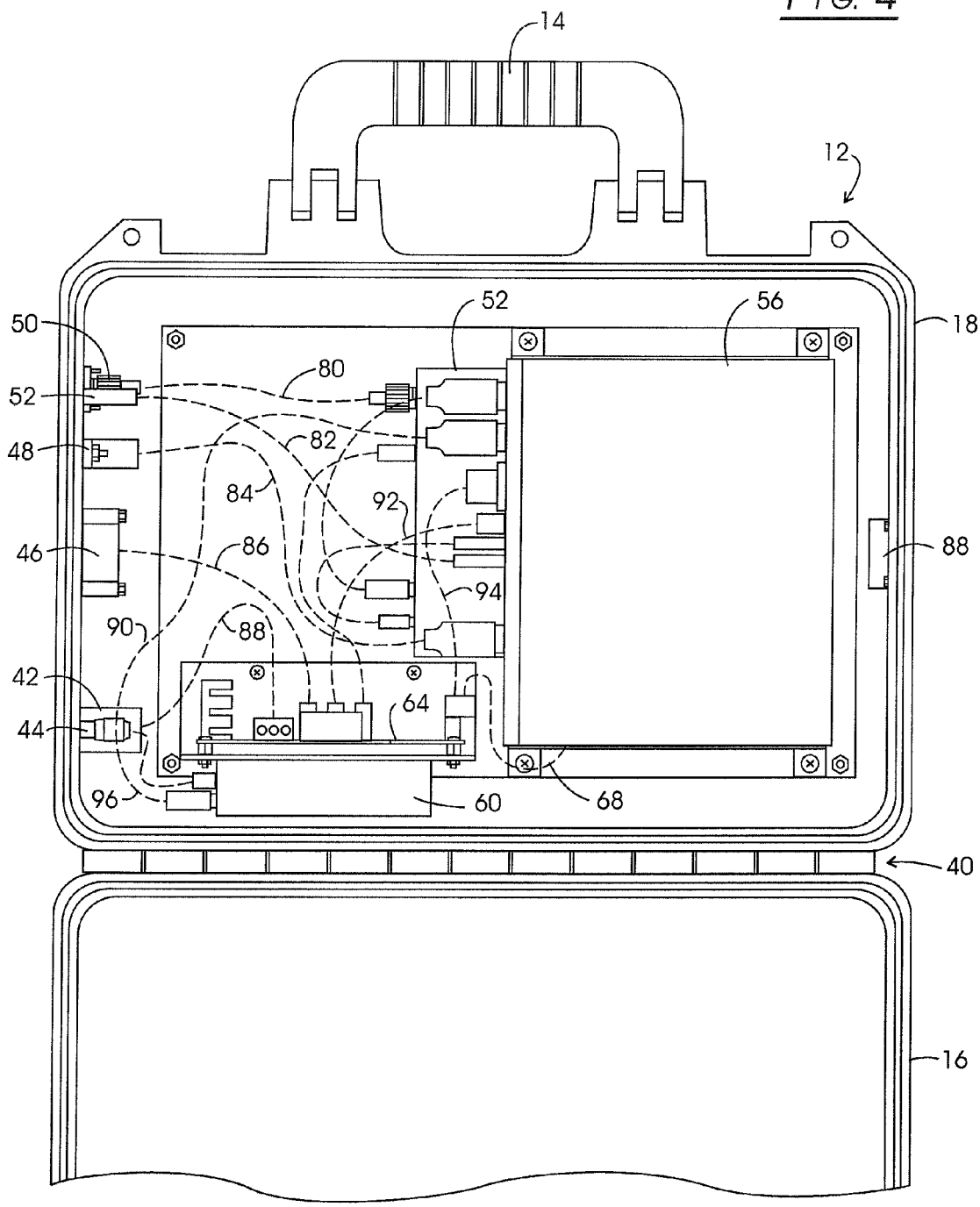
FIG. 4 is a plan view of the carrying case of FIG. 1 showing it in an open orientation.

Looking to FIG. 4, the interior of housing 12 is revealed, components heretofore described being identified with the same numeration. Additionally, a circuit association of components is revealed somewhat in general by dashed lines. In this regard, a dashed line 80 is seen extending between the connector for a wideband receiving antenna 36 and wideband radio receiver 52. A dashed line representing audio-out is shown at 82 extending from connector 51 to control computer 56. GPS input to the control computer 56 is shown at dashed line 84. Power is shown supplied to fan 46 as represented at dashed line 86. Vehicle power-in earlier described at connector 42 in connection with FIG. 2 is shown coupled with power control board 64 as represented at dashed line 88. Connection between cellular modem 60 and control computer 56 is shown at dashed line 90. Power-in to control computer 56 is represented at dashed line 92, while power monitoring is represented at dashed line 94. A communication of modem 60 with earlier-described connector 44 (FIG. 2) is represented at line dashed line 96.

Figure 5:
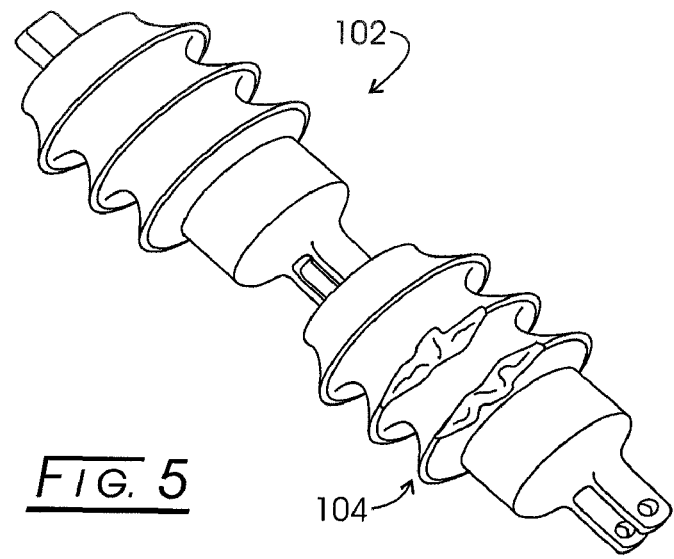
FIG. 5 is a perspective view of a distribution network insulator component which is defective.

Arcing may occur in connection with a broad variety of components or structures within a given power distribution network. The arc is characterized in having a waveform which very rapidly rises and then decays. This creates a radio frequency interference condition which often is a precursor to breakdown of regions of a distribution network. Arcing and subsequent breakdown can occur in conjunction with a broad variety of network components. In this regard, an exemplar of a failed component is represented in FIG. 5 wherein there is pictorially represented in general at 102 a broken distribution insulator. Such insulators as at 102 may, for example, support a 13.5 kV conductor. Note that damage is represented in general at 104. With such damage, the electric field surrounding the insulator will begin to leak through the broken region and the partial discharge near sharp edges of the fracture will be observed to emit specific signals (EMI) that are detectable. Left uncorrected, the end result would be a flashover of the insulator and an outage of the distribution circuit. A detailed review of such component defects is provided in the following publication:

Loftness, "A.C. Power Interference Handbook", Second Edition Revised, 2003, Percival Technology, Tumwater Wash. 98501.

Figure 7:
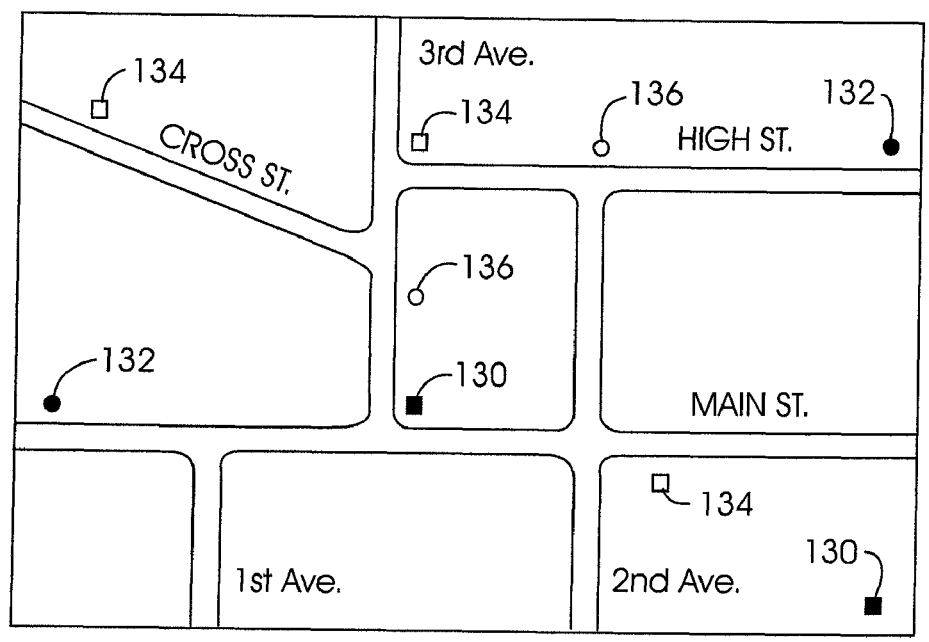
FIG. 7 is a schematic representation of a map produced by the instant system.
Figure 6:
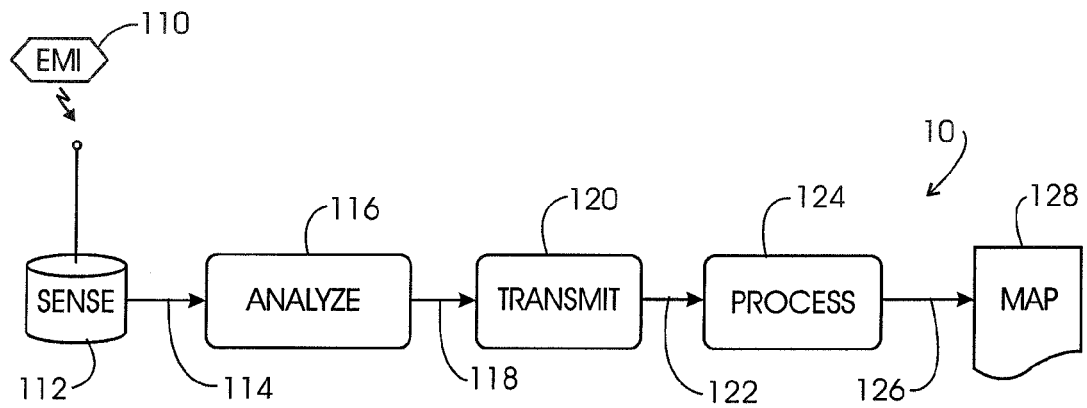
FIG. 6 is a block diagram of the instant system.

In a general context, the present system and method is represented in connection with FIG. 6. Looking to that figure, arcing phenomena (EMI) is represented at symbol 110 which is sensed as represented at symbol 112 then, as represented at arrow 114 and block 116, arcing phenomena are analyzed with respect to global position in combination with a significance of an emission as translated into a multi-dimensional parameter referred to as "maintenance merit". Maintenance merit is a measure of the significance of an emission from an arc source that includes evaluations such as: R.F. emission spectrum; narrowband emission strength; demodulated narrowband discharge emission spectrum; narrowband discharge emission signature; fundamental and second harmonic detection (typically 25/50 Hz (Amtrack); 50/100 (Europe); or 60/120 Hz (USA)). The parameter further incorporates detected signal temporal information. With these components, the significance level of an arc may be detected such that it may be prioritized. Next, as represented at arrow 118 and block 120, the position related maintenance merit data is transmitted via cellular modem for processing by a server as represented at arrow 122 and block 124. Once so processed, a map of the region of interest is produced or displayed as represented at arrow 126 and block 128. In general, the map will identify locations of arcing along with maintenance merit level indication, for instance, with a color coding scheme. Such a map is schematically represented in FIG. 7. Looking to that figure, maintenance merit levels are identified symbolically, for example, a highest level is represented at darkened squares 130. A next lower level of priority is represented at darkened dots 132. A third lower level of maintenance merit is represented at open squares 134; and a lowest level of maintenance merit is represented at open dots 136.

Figure 8:
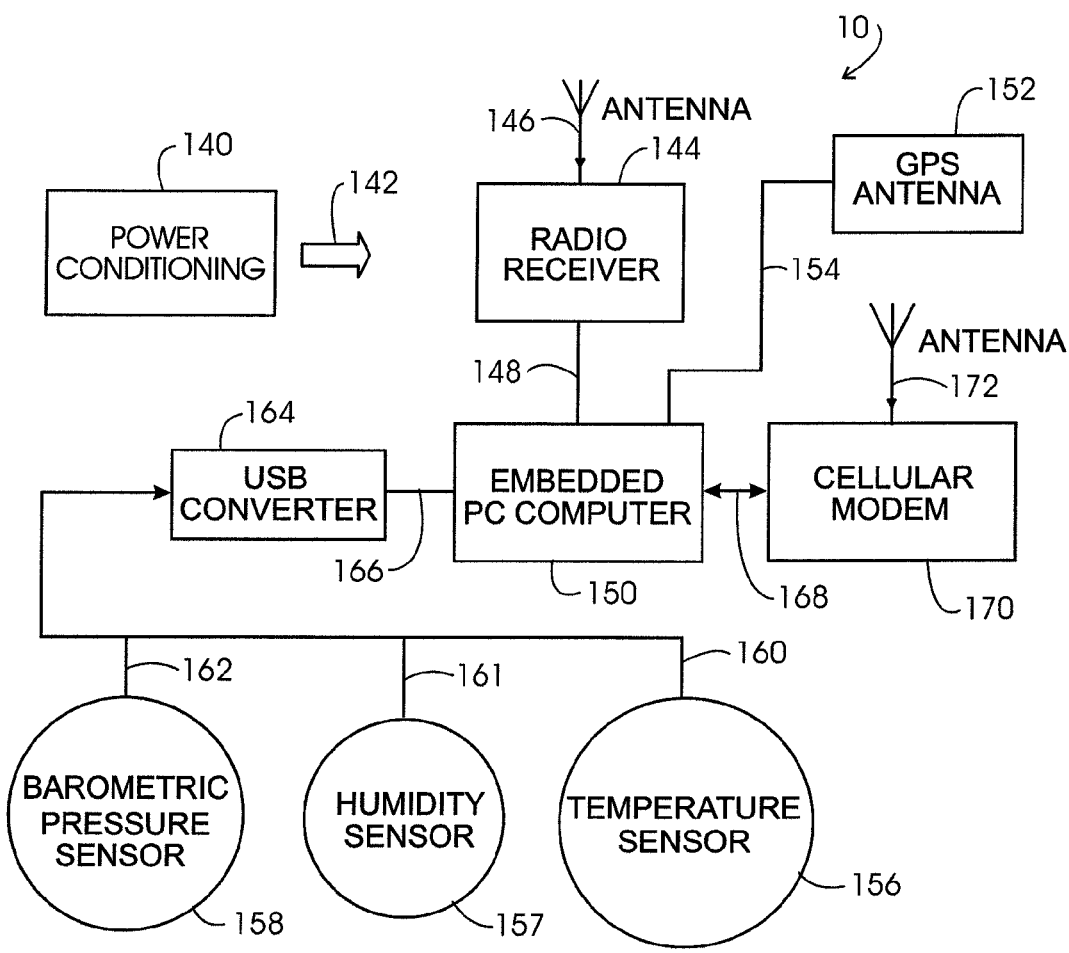
FIG. 8 is a block diagram of the instant system showing its incorporation of weather condition data.

Referring to FIG. 8, a next level of detail of the instant system is revealed. Power is derived from the transporting vehicle as represented at block 140 and arrow 142. The receiving assemblage of the system is represented at block 144 and the antenna symbol 146. Received data is provided as an amplitude detected output as represented at line 148 which is directed to an embedded computer 150. Additionally introduced to the control computer function at block 150 is global positioning system data as represented at block 152 and line 154. Because arcing phenomena are influenced by weather conditions, as represented at circles 156-158 and respective lines 160-162, temperature, humidity and barometric pressure data are directed as represented at block 164 and line 166 to the control computer 150. Finally, global positioning, maintenance merit and weather data are generated and transmitted through a cellular network to a processing function as described in connection with FIG. 6 at 124 and herein shown as dual arrow 168, block 170 and antenna symbol 172.

Figure 9:
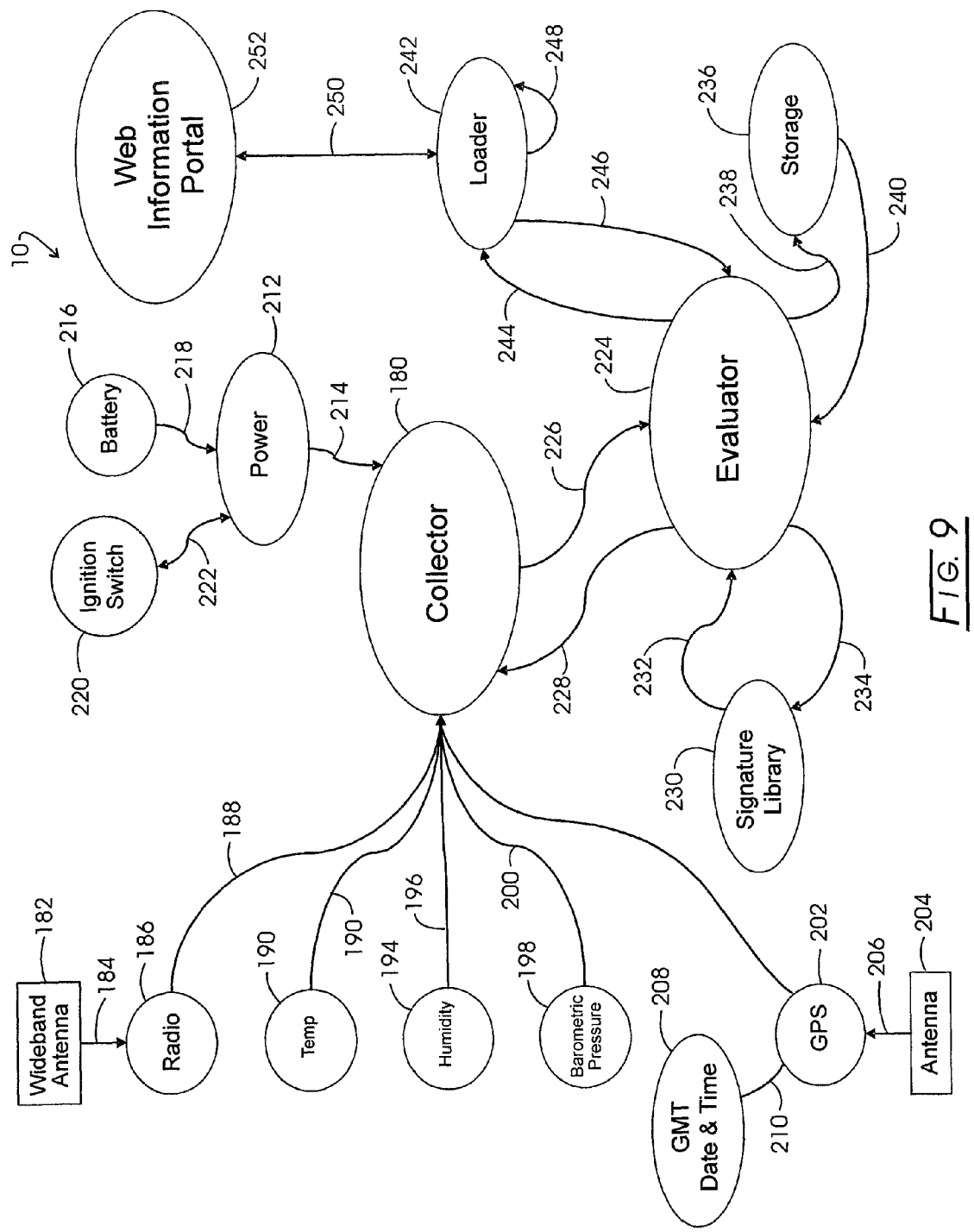
FIG. 9 is a symbolic diagram of the instant system.

Referring to FIG. 9, a generalized representation of system 10 is presented. In the figure, centrally disposed is a collector function represented at symbol 180. A variety of data is collected at function 180. In this regard, a wideband antenna is represented at block 182 and arrow 184 as associated with a wideband amplitude detect radio shown at symbol 186. The association of the radio function 186 and collector function 180 is represented at line 188. Temperature input to the collector function 180 is represented at symbol 190 and line 192. Humidity data is introduced to collector function 180 as represented at symbol 194 and line 196 and, similarly, barometric pressure data is also submitted as represented at symbol 198 and line 200. Global positioning system information is represented at symbol 202. Note that symbol 202 is represented as associated with an appropriate antenna as represented at block 204 and arrow 206. Additionally, the symbol 202 function is associated with Greenwich Mean Time and date data as represented at symbol 208 and line 210.

System power control is represented at symbol 212 seen associated with the collector function 180 as represented at arrow 214. As noted above, the power input to the power supply function 212 is provided from an associated vehicle battery as represented at symbol 216 and arrow 218. That power input is logically controlled from the ignition switch of the vehicle as represented at symbol 220 and dual arrow 222.

The data collector function 180 is interactively associated with an evaluation or evaluator function as represented at symbol 224 and interactive arrows 226 and 228. The evaluation function 224 may perform in conjunction with an arcing phenomena signature library as represented at symbol 230 and interactive arrows 232 and 234. A general storage function is represented at symbol 236 along with interactive arrows 238 and 240. The cellular modem based up-loader function is represented at symbol 242 along with interactive arrows 244 and 246. In general, when the vehicle ignition switch is turned to an off position, uploading takes place. Where such uploading is not successful, the system 10 will carry out a retry, repeating three times as represented by loop arrow 248. As represented at dual arrow 250 and symbol 252 uploading as well as downloading takes place in conjunction with a web information portal or server.

Figure 10:
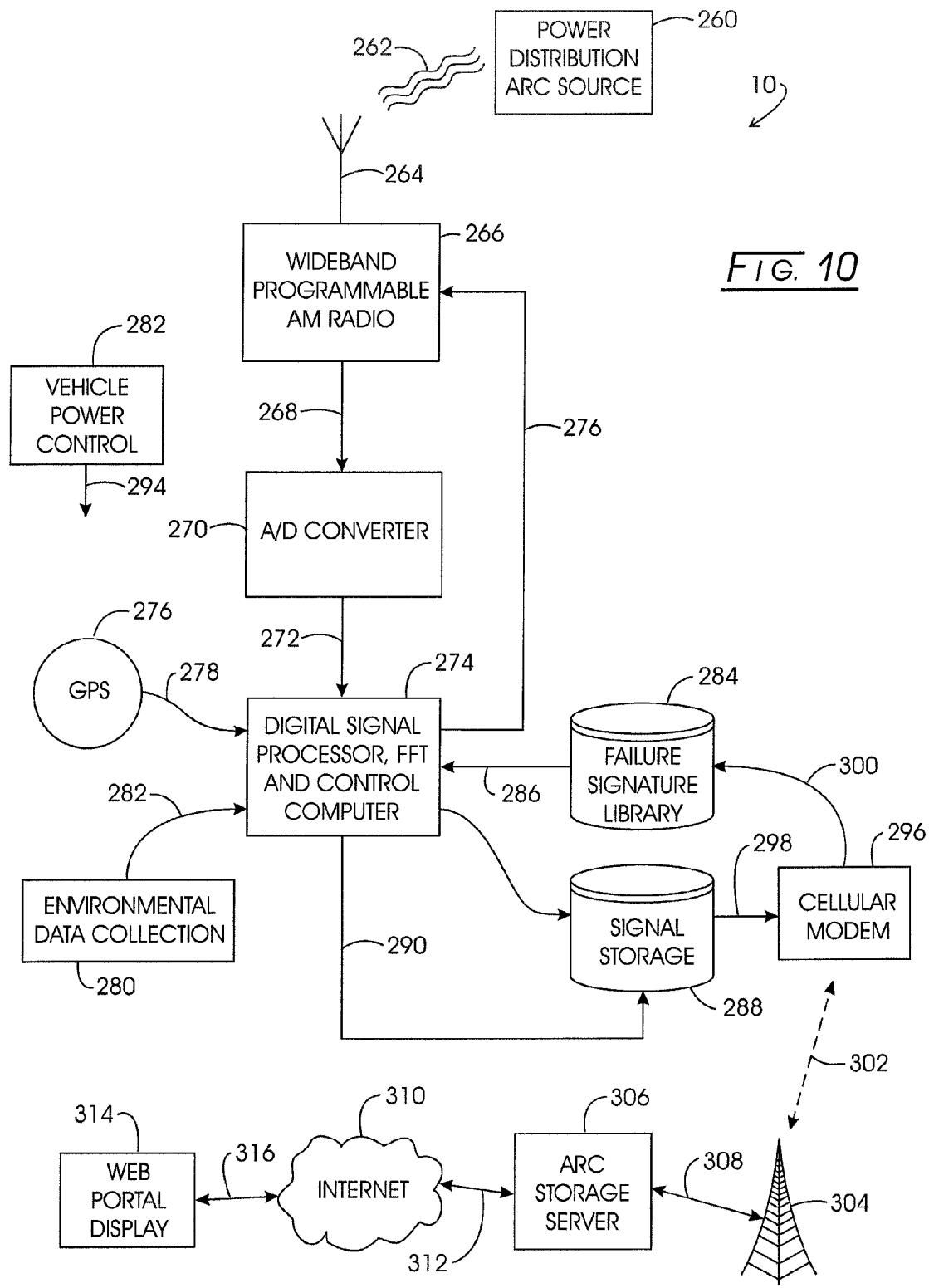
FIG. 10 is a symbolic representation of the instant system.

System 10 is further represented in connection with FIG. 10. Looking to that figure, block 260 and associated R.F. emission symbol 262 are represented as interacting with a wideband antenna function represented at symbol 264. Wideband antenna function 264 performs in conjunction with a computer controlled wideband programmable AM radio as represented at block 266. The function at block 266 provides an amplitude detected arc signal as represented at arrow 268 to an analog-to-digital converter function represented at block 270. Function 270 provides digital samples as represented at arrow 272 to a function represented at block 274. At block 274, a digital signal processor configured for carrying out arc detection and analysis is provided including fast Fourier transforms of the digital samples, extracting narrowband signal frequencies therefrom that are harmonically related to the fundamental frequency of the distribution system, analyzing the harmonically related narrowband frequencies for peak amplitudes and summing such peak amplitudes to derive maintenance merit values. Function 274 further includes a control computer which functions, inter alia, to provide a radio frequency control over the wideband AM radio function 266 as represented at arrow 276. Further provided to the function 274 is global positioning system data as represented at symbol 276 and arrow 278. Weather or environmental data additionally is made available to the function 274 as represented at block 280 and arrow 282. In carrying out its arc analysis, the function 274 may perform in conjunction with a failure signature library as represented at symbol 284 and arrow 286. Retained within this function 284 are detected and analyzed arc data including fast Fourier transforms of digital samples, extracted narrowband signal frequencies that are harmonically related to the fundamental frequency of the network, the peak amplitudes of such analysis, a radio frequency spectrum of the analysis, an accept/reject signature event indicator, a signature part type, a signature part number and associated manufacturer. Maintenance merit values or arc strength are submitted to computer storage as represented at symbol 288 and arrow 290. Power to the entire system 10 is provided as above described and is represented in the instant figure at block 292 and arrow 294.

Returning to storage function 288, with the actuation of an associated vehicle ignition switch to an off orientation computer controlled uplifting takes place utilizing a cellular modem as represented at symbol 296 and arrow 298. As represented at arrow 300, cellular modem function 296 also performs a feature of adding data to the failure signature library function 284. An uploading of data by the cellular modem function 296 also functions to broadcast via a cell phone network as represented at dual arrow 302 and symbol 304. The cell phone network 304 additionally functions to interact with an arc storage server as represented at block 306 and dual arrow 308. Dual arrow 308 represents a feature wherein the function 274 may be upgraded from a remote server location. Arc storage server function 306 performs in conjunction with the internet as represented at symbol 310 and interactive arrow 312. The internet communicates arc event strength location and display to a web portal display function as represented at block 314 and dual arrow 316. Display function 314 may, for example, publish a map as described in connection with FIG. 7.

Figure 11:
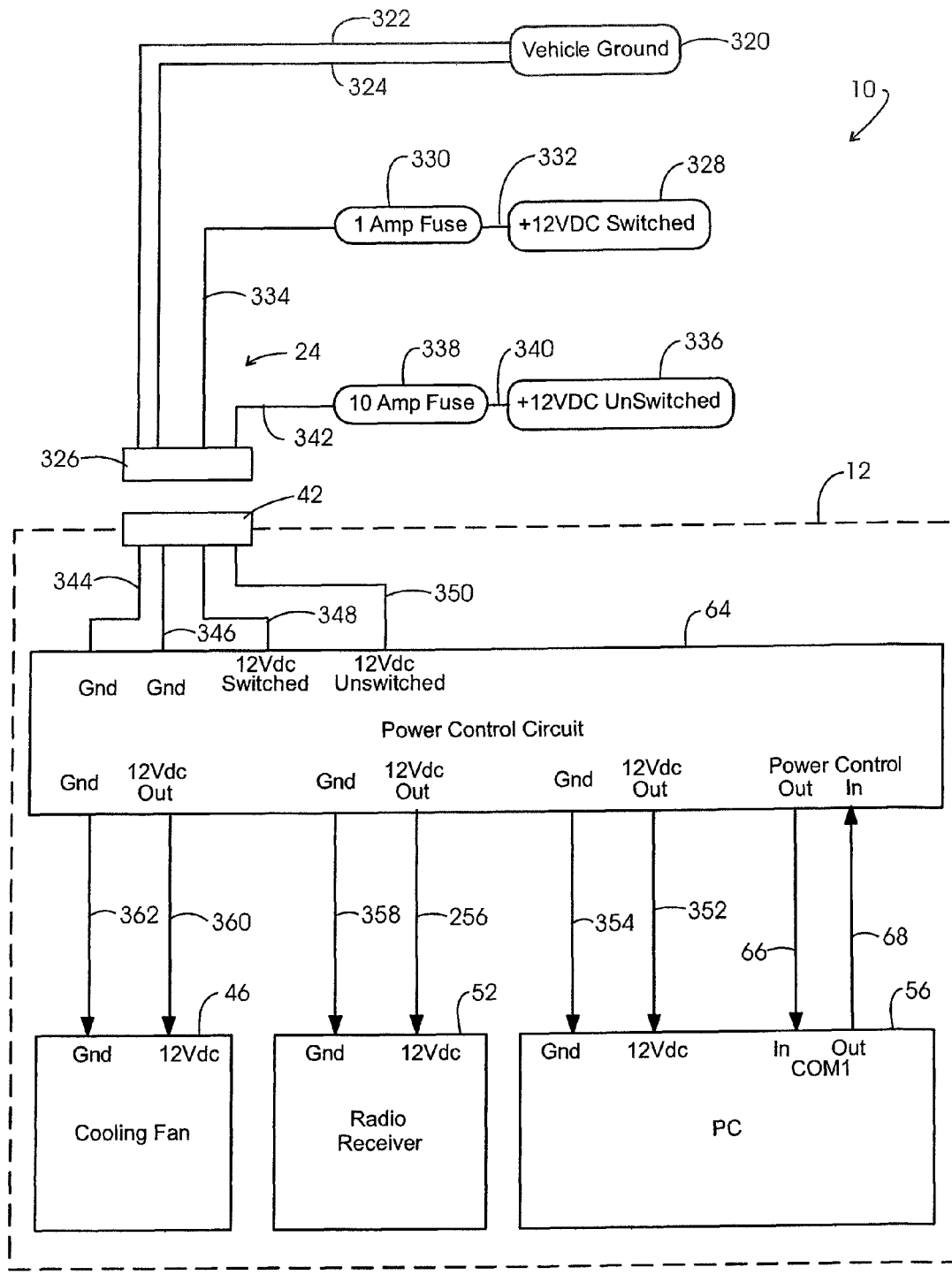
FIG. 11 is a block diagram of a power supply approach to the instant system.

Powering function of system 10 has been discussed, for example, in connection with FIG. 3. Looking to FIG. 11, a more detailed rendition of the power utilization feature of system 10 is represented. In the figure, vehicle ground is represented at symbol 320 in conjunction with lines 322 and 324 extending to a connector represented at block 326. Also extending to connector 326 is a +12 volt d.c. switched power input represented at symbol 328. Symbol 328 is shown associated with a one amp fuse function as represented at symbol 330 and line 332. Connection with connector 326 from the fuse function 322 is represented at line 334. +12 volt un-switched vehicle power is represented at symbol 336. This un-switched power function is represented as being directed through a 10 amp fuse as shown at symbol 338 and line 340, whereupon connection with the connector 326 is represented at line 342.

Connector 326 couples to connector 42 as described in FIG. 2 which is represented in block form with the same numeration at the dashed boundary representing housing 12. Connector 42 provides vehicle ground as represented at lines 344 and 346 as well as the earlier-described 12 volt d.c. switched power input at line 348 and un-switched power input as represented at line 350. Lines 344, 346, 348 and 350 extend to corresponding inputs of power control circuit 64. Function 64 is under the control of the control computer represented again at block 56. In this regard, power monitor arrows 68 reappears in conjunction with power-in or shutdown command arrow 66. 12 volts d.c. is provided to control computer function 56 as represented at arrow 352 and ground is similarly supplied as represented at arrow 354. The wideband radio receiver function earlier-described at 52 in connection with FIG. 3 is shown receiving 12 volts d.c. as represented at arrow 356 and corresponding ground as represented at arrow 358. Similarly, cooling fan 46 receives 12 volts d.c. as represented at arrow 360 and ground as represented at arrow 362.

Figure 12:
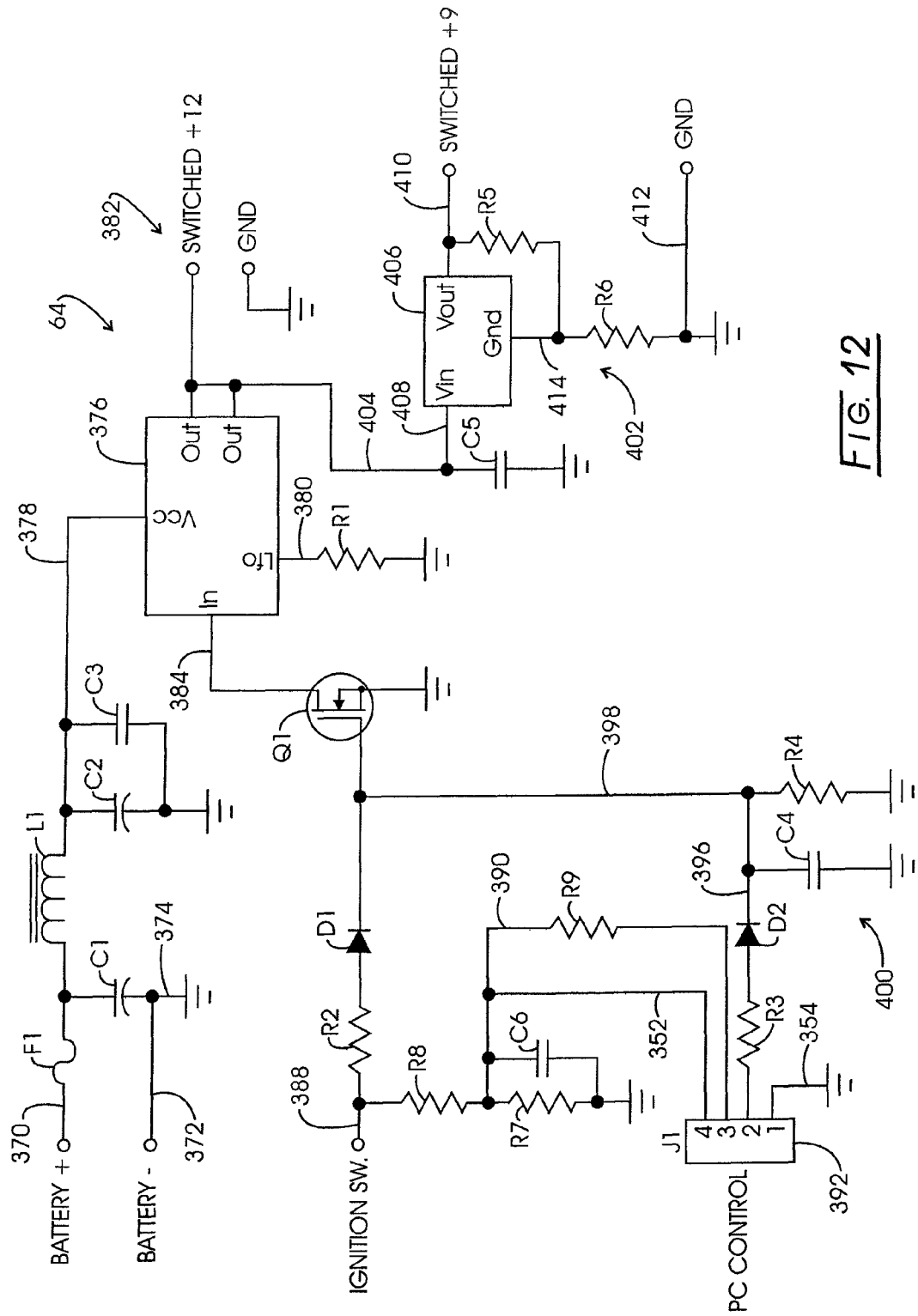
FIG. 12 is an electrical schematic representation of portions of the power control circuit of FIG. 11.

Referring to FIG. 12, the power control circuit function earlier-described at 64 is illustrated at an enhanced level of detail. In the figure, the +vehicle battery input is provided at line 370 while corresponding negative battery connection is represented at line 372 extending to ground at line 374. Line 370 incorporates a 10 amp fuse F1 and the battery input is filtered for noise control purposes by capacitors C1-C3 and inductor L1. The filtered output of the battery input is presented to the Vcc terminal of a solid state switch 376 as represented at line 378. Switch function 376 may be, for example, a type IR 3314 and its current control is provided by resistor R1 located within line 380 between device 376 and ground. The output of switch 376 is represented in general at 382. This output is repeated on the control board five times. Switch 376 is turned off and on by a field effect transistor Q1, the drain of which is coupled via line 384 to device 376 and the source of which is coupled via line 386 to ground. Transistor Q1 is turned on either by the actuation of a vehicle ignition switch to an on position or by an output of the control computer of the system. The control computer function 56 signal produces an output shortly after the control computer power 382 is applied by actuation of the vehicle ignition switch to the on position. The ignition switch signal at line 388, incorporating resistor R2 and a form of steering diode D1 is coupled to the gate of transistor Q1. The input at line 388 is divided down by a network incorporating resistors R7 and R8 and a filtering capacitor C6. Line 390 incorporating resistor R9 extends to a terminal 392 representing an input to the control computer corresponding with line 66 described in connection with FIG. 3. Thus, the computer function is provided a signal representing that ignition has been turned off. A line 394 also extends to terminal 392. Upon receiving a signal that the vehicle ignition has been turned off, the computer control function 56 continues to provide an output at lines 396 and 398 extended to line 388 to keep transistor Q1 on until the cellular modem data upload function (FIG. 10, Block 296) is complete, at which time the computer control function 56 signal is removed turning off transistor Q1. This control computer serving network as represented at 400 incorporates a steering diode D2, divider resistors R3 and R4 and a filtering capacitor C4. Line 396 corresponds with earlier-described line 68 in FIG. 3.

Additional regulator networks may be provided in conjunction with the output of device 376. In this regard, note that the output of that device additionally is coupled to a network represented generally at 402 via line 404. Network 402 includes a regulator 406 which may, for example be a type LM 317T with an input at line 408 and an output at line 410. Device 406 is configured with resistors R5 and R6 as well as capacitor C5. Ground is provided from lines 412 and 414.

In the discussion to follow, block diagrams are presented describing the software activity of system 10. Three approaches are described, one involving a single AM radio function; one involving two such radio functions; and the third describing a single radio with a signature analysis feature. The blocks and symbols making up the block diagrams have been provided using the SDL-2000 standardized specification and description language.

Figure 13:
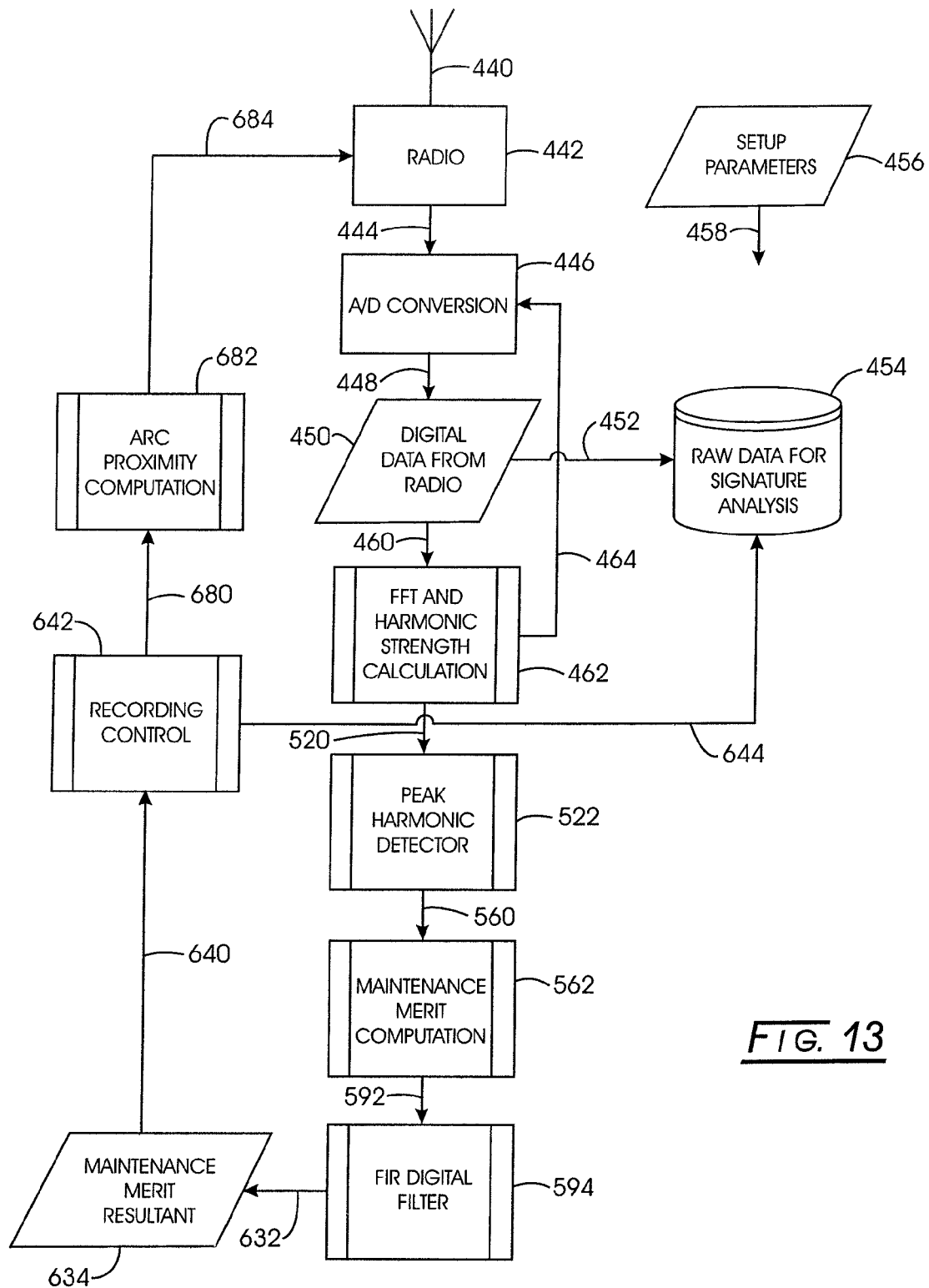
FIG. 13 is a software block diagram of a single radio embodiment of the present system.

Looking to FIG. 13, a general block diagram of the single radio embodiment is set forth. A wideband antenna is represented at symbol 440 which is operationally associated with a computer controllable wideband radio receiver represented at block 442. The amplitude detected output of radio 442 will be between 0 and 6 kHz as represented at arrow 444. The amplitude detected output then is converted to digital form by an analog-to-digital (A/D) converter function represented at block 446. Sampling rate derived digital samples then are available as represented at arrow 448 and symbol 450. Such digital data is made available to raw data storage as represented by arrow 452 and symbol 454. Just above symbol 454 is symbol 456 and arrow 458 providing for the setting up of parameters for all blocks of the diagram. Returning to symbol 450, as represented at arrow 460 and block 462, the digital samples are submitted to a fast Fourier transform (FFT) and harmonic strength calculation function. Note that block 462 addresses the conversion block 446 via arrow 464 to provide for sampling rate control.

Now considering the FFT, the width of one frequency bin in an FFT can be calculated as "Sample Rate SR÷FFT Sequence Length". Therefore, to provide an exact 60 Hz bin and to fulfill a requirement of two calculations per second, the optimal combination is "Sample Rate=2*FFT Sequence Length". The frequency bin resolution is then 2.0 Hz and the FFT bins are at 2, 4, 6, . . . , 60, . . . , 120 Hz, etc.

In order to perform an FFT in a fast and efficient way, the FFT Sequence Length must be a power of 2. To be able to extract exact FFT values for desired frequencies and to provide desired data rate, predefined values for sampling rate and FFT length are used. The following is a tabulation of sampling rates in samples per second; FFT length (samples) and number of FFTs in one second for three frequencies, 60 Hz (USA); 50 Hz (Europe); and 25 Hz (Amtrack).

| Frequency (Hz) | Sampling rate(samples/sec) | FFT length (samples) | Number of FFTs in one second |
| --- | --- | --- | --- |
| 60 | 32768 | 16384 | 2 |
| 50 | 32768 | 16384 | 2 |
| 25 | 40960 | 16384 | 2.5 |

After the tabulations the following parameters are adjustable and set in system 10:

1. Number of channels is 1 or 2 (one for each radio)
2. Main power line frequency (25, 50 or 60 Hz)
3. Number of harmonics to calculate (1-100)
4. Filter Width in number of FFT values to be taken into account (0 means exact frequency value, 1 means exact value and its left/right neighbors, etc.). The output value for a single harmonic is calculated as:

$$H_i = \frac{\sum_{k=-FW}^{=FW} F_{i+k}}{FW+1}$$

Where:
FW=Filter Width
Hi=Harmonic magnitude value where (i) is harmonic number in the FFT
Fi=FFT magnitude value where (i) is the value index in the FFT For optimum power line arc discrimination against other noise sources the filter width should be as narrow as possible. Since the filter width is inversely proportional to the FFT Sequence Length, a longer length (and sample time) can be chosen to improve arc signal discrimination.

Figure 14:
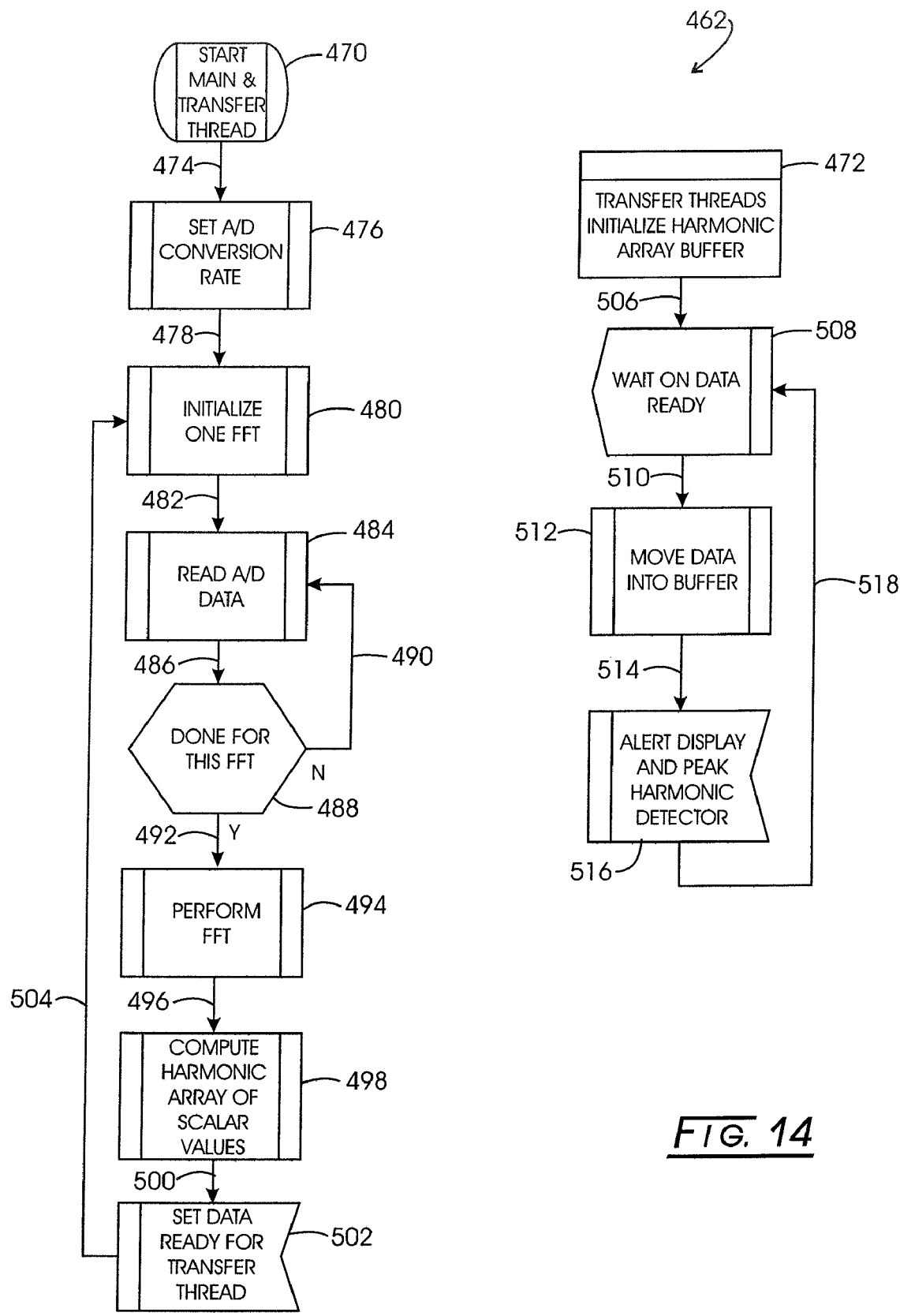
FIG. 14 is a block diagram of the software associated with FFT and harmonic strength calculations as represented in FIG. 13.

Now looking momentarily to FIG. 14, block 462 is further diagrammed to provide greater detail. Looking to that figure, symbol 470 represents the start of the main and transfer software thread. In the latter regard, as represented at block 472 the transfer thread carries out an initialization of the harmonic array buffer.

Returning to block 470, as represented at arrow 474 and block 476, the analog-to-digital conversion rate is set. Next, as represented at arrow 478 and block 480, one FFT is initialized and as represented at arrow 482 and block 484 digital samples from the A/D conversion process are read. This collection procedure continues as represented at arrow 486 and symbol 488 determining whether the collection procedure is done for this FFT. In the event that it is not completed, the procedure continues as represented a loop arrow 490. Where data collection is completed, then as represented at arrow 492 and block 494, the fast Fourier transform is performed. Following performance of the FFT, as represented at arrow 496 and block 498, a harmonic array of harmonically related scalar values is computed and, as represented at arrow 500 and symbol 502, data ready is set for the transfer thread (block 472) and the procedure loops to initiate a next FFT as represented at loop arrow 504.

Returning to block 472, as represented at arrow 506 and symbol 508, the procedure awaits the data ready condition as was set at block 502. When the data is ready, as represented at arrow 510 and block 512, the data is moved into a buffer and, as represented at arrow 514 and symbol 516, the display and peak harmonic detector are alerted, whereupon the procedure loops to symbol 508 as represented at arrow 518.

Returning to FIG. 13, with the completion of FFT and harmonic strength calculation as represented at block 462, as indicated at arrow 520 and block 522, the system analyzes the harmonically related narrowband frequencies for peak amplitudes.

Figure 15:
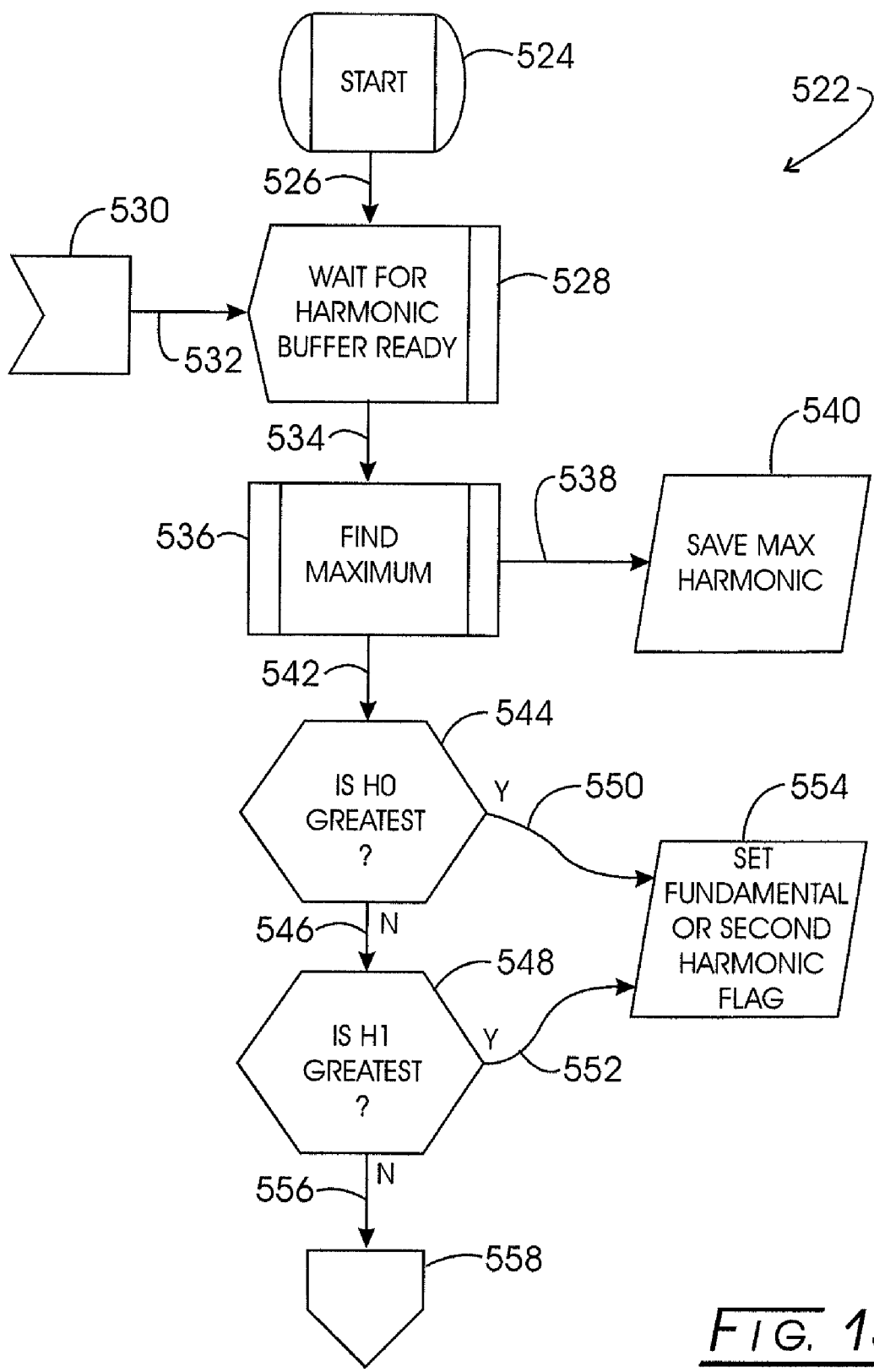
FIG. 15 is a block diagrammatic representation of peak harmonic detection as described in connection with FIG. 13.

Looking momentarily to FIG. 15, this peak detection feature is diagramed at an enhanced level of detail. In the figure, the procedure commences in conjunction with start symbol 524 and arrow 526 extending to symbol 528. Symbol 528 provides for the awaiting of a harmonic buffer-ready signal which, for example, will be developed from symbol 516 described in connection with FIG. 14. With the presence of a harmonic buffer-ready indication, as represented at arrow 534 and block 536, a maximum value is found and as represented at arrow 538 and block 540, that max harmonic peak amplitude is saved. Next, as represented at arrow 542 and symbol 544, a determination is made as to whether H0, which is the power network fundamental frequency is greatest. If it is not, then as represented at arrow 546 and symbol 548, a determination is made as to whether the max amplitude is at a first harmonic of the fundamental frequency. Where the query posed at either of symbols 544 or 548 results in an affirmative determination, then as represented at either arrow 550 or arrow 552, the fundamental or harmonic flag is set as indicated at symbol 554. In the event of a negative determination at symbol 548, then as represented at arrow 556 and symbol 558, the procedure returns to FIG. 13 and arrow 560. In considering the setting of the flags at symbol 554, temporal information about an arc phenomena becomes available as a very basic signature of the instant system. For instance, if a max amplitude is associated with just the positive or the negative going components of an assumed sinewave, then H0 flag is set. On the other hand, where such amplitude is seen on both positive and negative going components of the waveform, then H1 is set.

Now returning to FIG. 13, arrow 560 is seen directed to block 562 calling for the computation of a maintenance merit value. In general, this is developed by summing the abovenoted peak amplitudes. Looking additionally to FIG. 16, this maintenance merit computation feature is diagramed in more detail. The function is shown entered as represented at symbol 570 and arrow 572 extending to block 574. Block 574 calls for the summing of all harmonics, whereupon, as represented at arrow 576 and block 578, an average of the summed harmonics is computed. Because all harmonics are sub-scale, as represented at arrow 580 and block 582, the computed average is scaled to full scale and, as represented at arrow 584 and symbol 586, the scaled average is saved as a current maintenance merit value. However, while usable with the system, this value may be filtered. The procedure represented by block 562 then returns as represented at arrow 588 and symbol 590. Accordingly, returning to FIG. 13, an arrow 592 is seen extending from block 562 to block 594 calling for the filtering of the maintenance merit computation employing a finite impulse response (FIR) filter. Such filters also are referred to as averaging filters and function to discriminate against noise. In general, the user will determine a filtering length of maintenance merit values, for example, up to 20. Looking to FIG. 17, the filtering function of block 594 is diagramed at a higher level of detail. In the figure, the filtering procedure is seen to commence in conjunction with symbol 600 and arrow 602. Arrow 602 leads to symbol 604 providing for saving the current maintenance merit values in the filter array, a limit of such values being elected for filtering. Next, as represented at arrow 606 and block 608, filtering is carried out by computing the sum of the maintenance merit values for, n, such values divided by the limit value. Upon carrying out this computational filtering, then as represented at arrow 610 and symbol 612 the filtered maintenance merit (MM) value is saved. As represented at arrow 614 and block 616, the index is increased by one. Next, as represented at arrow 618 and symbol 620 a determination is made as to whether the index (n) is greater than the limit value minus one. In the event that it is, then as represented at arrow 622 and block 624, the index, n, is set to zero and as represented at arrows 626, 628 and symbol 629, the procedure returns to block 594 in FIG. 13. As represented by arrow 628 and symbol. 629, the procedure reverts to block 594 shown in FIG. 13. Returning to that block, arrow 632 is seen to extend therefrom to symbol 634 showing that the maintenance merit value now is a resultant one in consequence of the FIR filtering. System procedure then continues as represented at arrow 640 and block 642 providing for recording control. In that regard, note that an arrow 644 extends to storage facility 454 as an indication that recording is to be started. It may be recalled that this is raw data for signature analysis.

Figure 18:
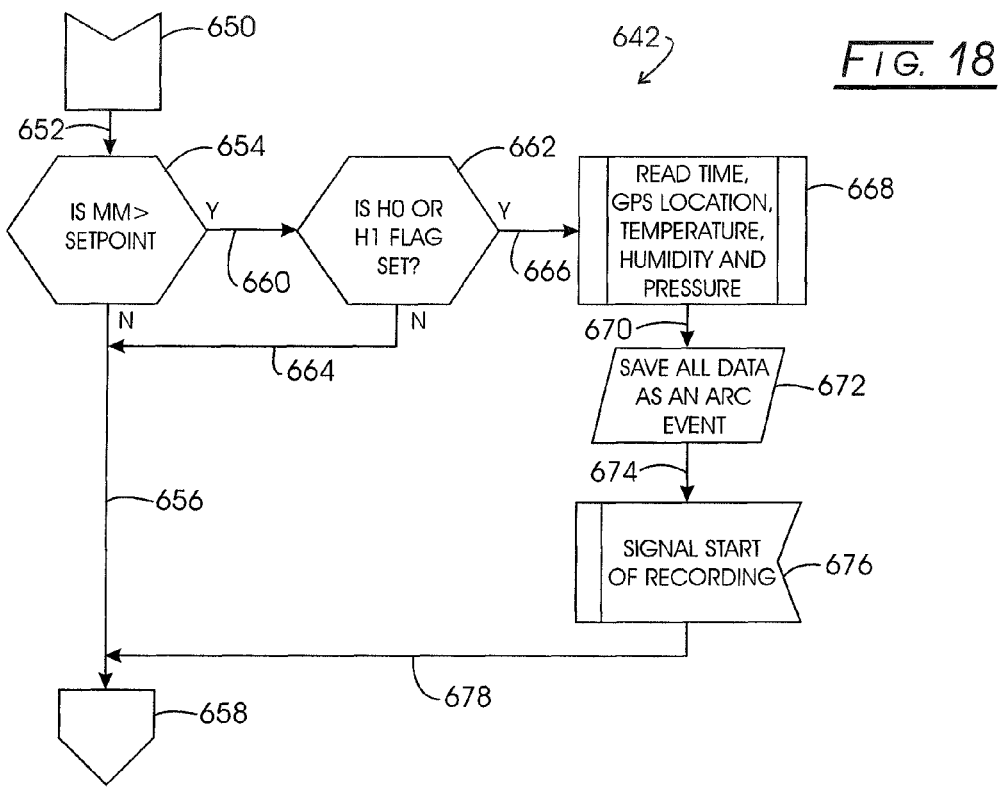
FIG. 18 is a block diagrammatic representation of a recording control function described in connection with FIG. 13.

Referring to FIG. 18, the recording control function 642 is revealed at a higher level of detail. In the figure, the function 642 is entered as represented at symbol 650 and arrow 652 extending to symbol 654 posing a query as to whether the maintenance merit value is greater than a pre-selected setpoint. If it is not greater, then that maintenance merit value is not recorded and the procedure continues as represented at line 656 and exit symbol 658. On the other hand, where the query at symbol 654 indicates that the instant maintenance merit value is greater than a setpoint, then as represented at arrow 660 and symbol 662, a determination is made as to whether the H0 or H1 flag is set. It may be recalled that H0 represents power line fundamental frequency, while H1 represents a first harmonic thereof. If neither of those flags is set, then the data is neither recorded nor utilized and the procedure continues as represented at arrows 664, 656 and symbol 658. On the other hand, where either of those flags is set, then as represented at arrow 666 and block 668, the system reads mean Greenwich time, GPS location, temperature, humidity and barometric pressure. As represented at arrow 670 and symbol 672, all such data is saved as an arc event and function 642 provides a signal to start recording as represented at arrow 674 and symbol 676. The procedure then reverts to arrow 656 and symbol 658 as represented at arrow 678.

Figure 19:
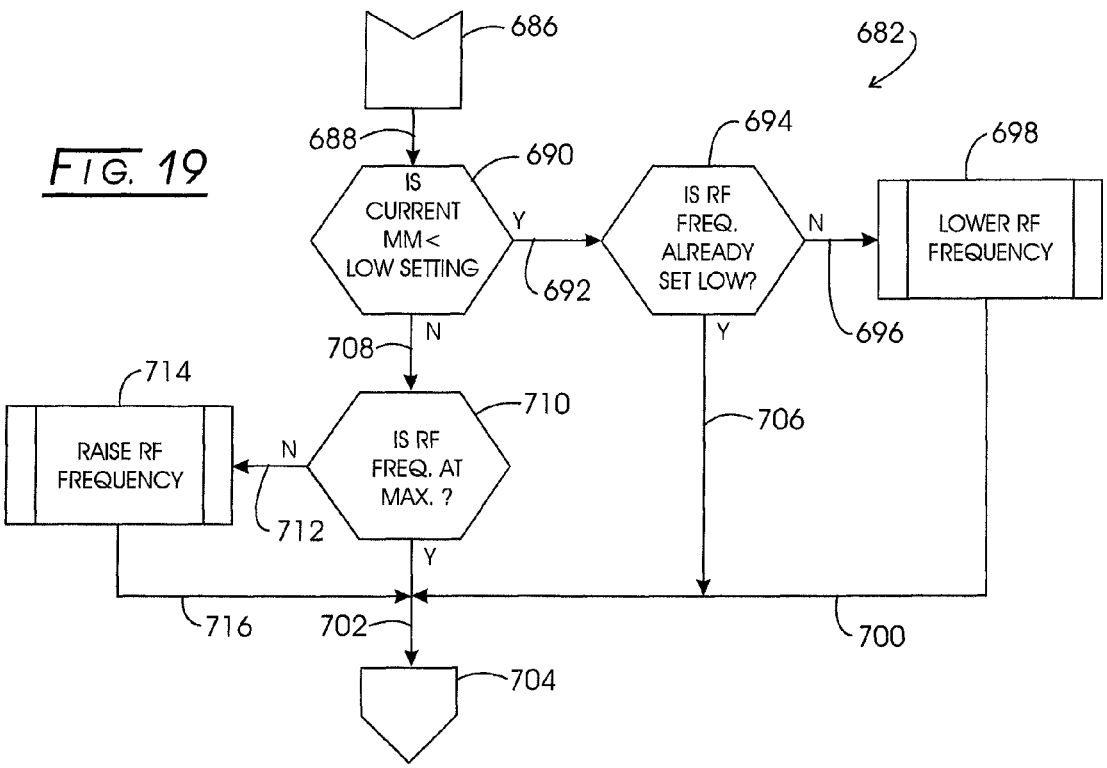
FIG. 19 is an arc proximity computation block diagram as described in connection with FIG. 13.

Returning to FIG. 13, as represented at arrow 680 and block 682, the system carries out an arc proximity computation implementing the computer controlled alteration of the frequency response of radio 442. This association is represented at arrow 684. Function 682 changes the frequency response at radio function 442 based upon the fingerprints being received. In this regard, if strong signals are being received, a higher radiofrequency response will be desired. This follows because of the nature of the arc signals encountered, the higher the radiofrequency of such signals more than likely the shorter the distance the system is from the arc phenomena. On the other hand, arc signal phenomena travels longer distances at lower radiofrequencies. Accordingly, an opposite form of frequency response adjustment may be called for. Looking to FIG. 19, arc proximity computation function 682 is illustrated at a higher level of detail. Function 682 is entered as represented at symbol 686 and arrow 688 which is directed to the query posed at symbol 690 determining whether the current maintenance merit value is less than a low setting. If that is the case, then as represented at arrow 692 and symbol 694, a determination is made as to whether the RF frequency already is set at a low frequency regime. If it has not been so set, then as represented at arrow 696 and block 698 the frequency response of radio function 442 is set lower and, as represented at arrows 700, 702 and symbol 704, the system returns to the peak harmonic detector function represented in FIG. 13 at 522. That same result obtains if the query posed at symbol 694 indicates that the RF frequency already has been set low. With such a setting the system reverts to peak harmonic detector function 522 (FIG. 13) as represented at arrows 706, 702 and symbol 704.

Returning to the query posed at symbol 690, where the current maintenance merit value is not less than a low setting, then, as represented at arrow 708 the system looks to the query at symbol 710 determining whether or not the RF frequency is at a maximum level. In the event that it is at that maximum level, the system again reverts to peak harmonic detector function 522 as represented at arrow 702 and symbol 704. On the other hand, where the RF frequency is not at a maximum level, then as represented at arrow 712 and block 714 the computer raises the frequency response of the radio function 442 and, as represented at arrows 716, 702 and symbol 704, the system reverts again to the function at block 522 in FIG. 13.

Figure 20:
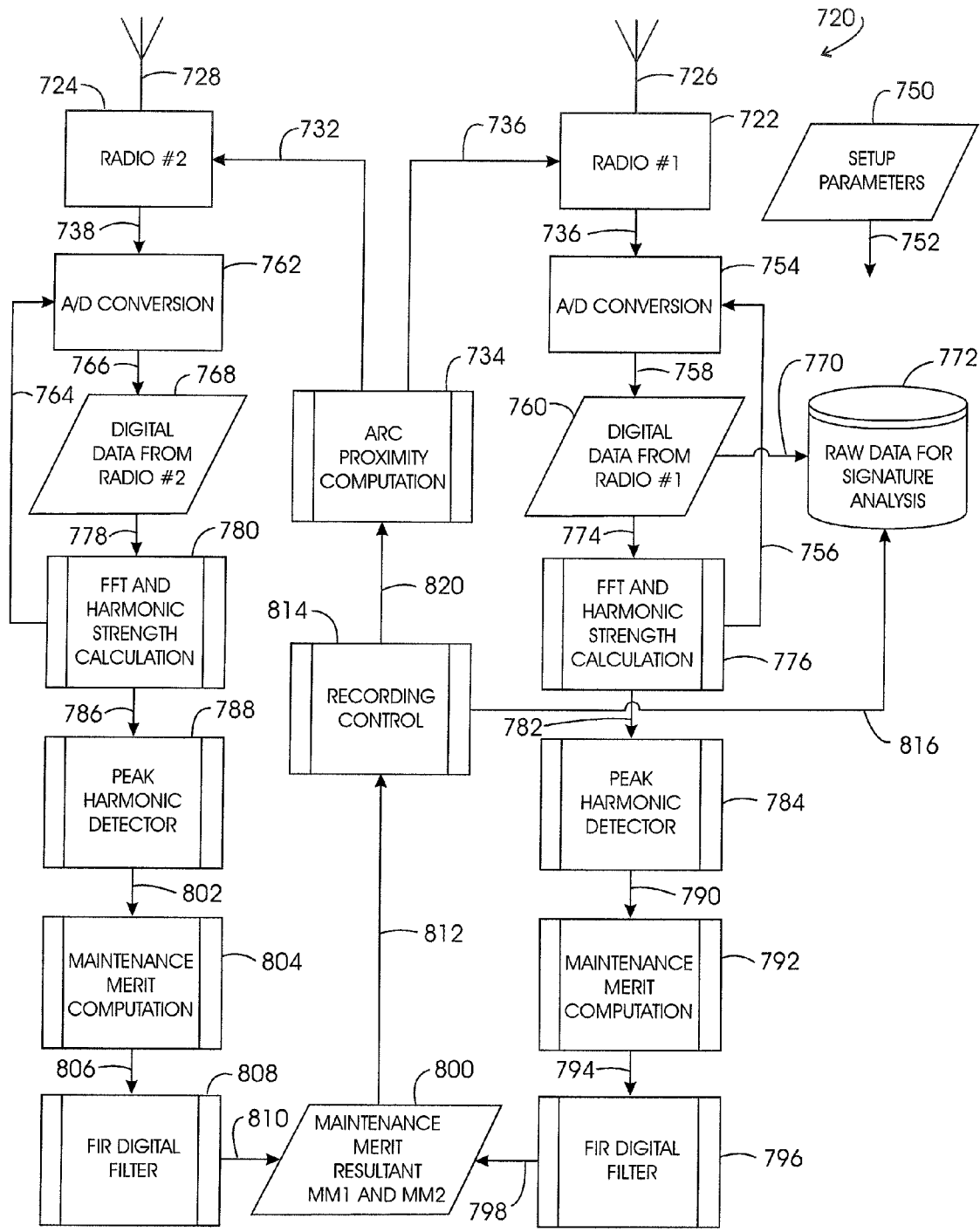
FIG. 20 is a software block diagram of a dual radio implementation of the instant system.

Improved arc phenomena detection and localization can be realized by employing the system 10 with two wideband computer controllable AM radios instead of one. Such a system is represented in general at 720 at the block diagram presented in conjunction with FIG. 20. In the figure, system 720 is seen to incorporate two wideband AM radios 722 and 724 performing in conjunction with respective antennae 726 and 728. The radiofrequency response of radios 722 and 724 again is computer controllable as represented at respective arrows 736 and 732 extending from an arc proximity computation function represented at block 734. As before, each of the radios 722 and 724 perform in conjunction with an amplitude detect output which, for example, may be in the range of 0-6 kHz. For convenience, computer controllable wideband radio receiver 722 is referred to herein as radio no. 1 and its amplitude detected output at arrow 736 is referred to as a first amplitude detected output. In similar fashion, computer controllable wideband radio receiver 724 is referred to herein as radio receiver no. 2 and its amplitude detected output is represented at arrow 738.

As in the case of FIG. 13 the block diagram of system 720 includes a setup parameters symbol 750, and arrow 752 from which indicates this feature applies to all blocks.

The first amplitude detected output as represented at arrow 736 from radio 722 is subjected to analog-to-digital conversion as represented at block 754. As before, this conversion is rate controlled as represented at arrow 756 and the output of this conversion as represented at arrow 758 provides what is designated herein as first high frequency parameter digital sample, representing digital data from the first radio as indicated by symbol 760.

In similar fashion, the output of radio no. 2 at arrow 738 may be designated as a second amplitude detected output which also is subjected to analog-to-digital conversion as represented at block 762. The sampling rate of converter 762 is computer controlled as represented at arrow 764 and its output as represented at arrow 766 is herein designated as second low frequency parameter digital sample represented, as shown in symbol 768 as digital data from radio no. 2. The signal data from radio no. 1 as represented at symbol 760, as in the case of FIG. 13, may be submitted as raw data for signature analysis to storage or memory as represented at arrow 770 and symbol 772. However, as represented at arrow 774 and block 776, it is also now subjected to fast Fourier transform activity and harmonic strength calculation. This is the same treatment as described at block 462 in FIG. 13 as well as in connection with FIG. 14. In similar fashion, the second low frequency parameter digital samples as represented at symbol 768 are treated with a fast Fourier transform and harmonic strength calculation as represented at arrow 778 and block 780. As before, this function is the same as that carried out in conjunction with block 462 in FIG. 13 and as described in FIG. 14.

Returning to block 776, a first digital signal processor has been provided which is configured for carrying out arc detection and analysis including fast Fourier transforms of the first digital samples, extracting narrowband signal frequencies, (bins) that are harmonically related to the fundamental frequency. Next, as represented at arrow 782 and block 784, the harmonically related narrowband frequencies are analyzed for peak amplitudes in a manner identical to that described in connection with block 522 of FIG. 13 and the discourse presented in connection with FIG. 15.

Turning back to block 780, a second digital signal processor is described which is configured for carrying out arc detection and analysis including fast Fourier transforms of the second digital samples, extracting narrowband signal frequencies therefrom (bins) that are harmonically related to the fundamental frequencies and as with radio 1, as represented at arrow 786 and block 788, analysis is carried out of the harmonically related narrowband frequencies for peak amplitudes in the same manner as described in connection with block 522 of FIG. 13 and corresponding FIG. 15.

Figure 16:
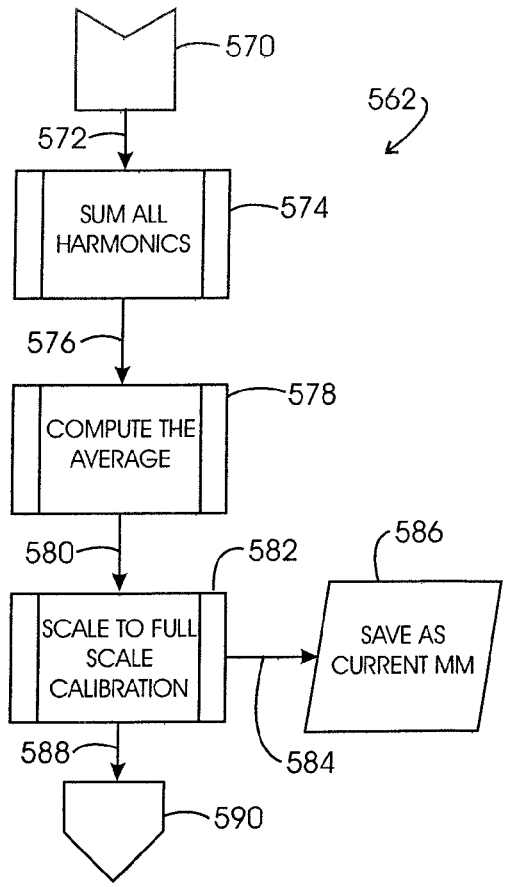
FIG. 16 is a block diagrammatic representation of maintenance merit calculation as described in connection with FIG. 13.
Figure 17:
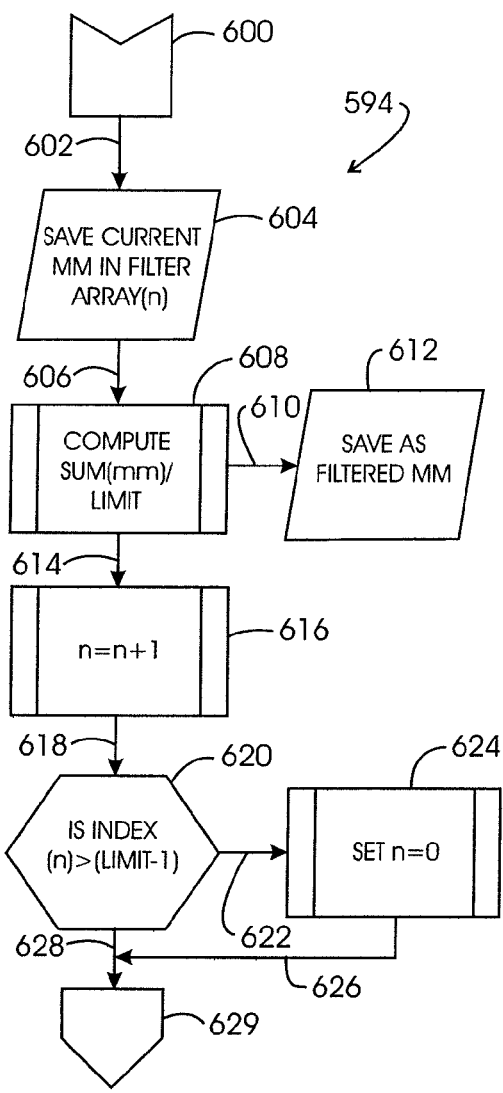
FIG. 17 is a block diagrammatic representation of an FIR filter function described in connection with FIG. 13.

An arrow 790 extends from block 784 to block 792 providing for maintenance merit computation in the same manner as described at block 562 in connection with FIG. 13 and as further described in connection with FIG. 16. Such maintenance merit values will be identified in the instant figure as "MM1". In this regard, as represented at arrow 794 and block 796, finite impulse response filtering is carried out in the same manner as described in conjunction with block 594 of FIG. 13 and as discussed in connection with FIG. 17. A maintenance merit resultant, MM1 thus is evolved as represented at arrow 798 and symbol 800.

Returning to the second radio component of the instant diagram, as represented at arrow 802 and block 804, a maintenance merit computation is carried out in the manner described in connection with block 562 of FIG. 13 and as described in connection with FIG. 16. Then, as represented at arrow 806 and block 808, the maintenance merit values are filtered utilizing a finite impulse response filter in the manner described at block 594 in FIG. 13 and as discussed in connection with FIG. 17. A result, as represented at arrow 810 and symbol 800 is a resultant maintenance merit, MM2.

Figure 21:
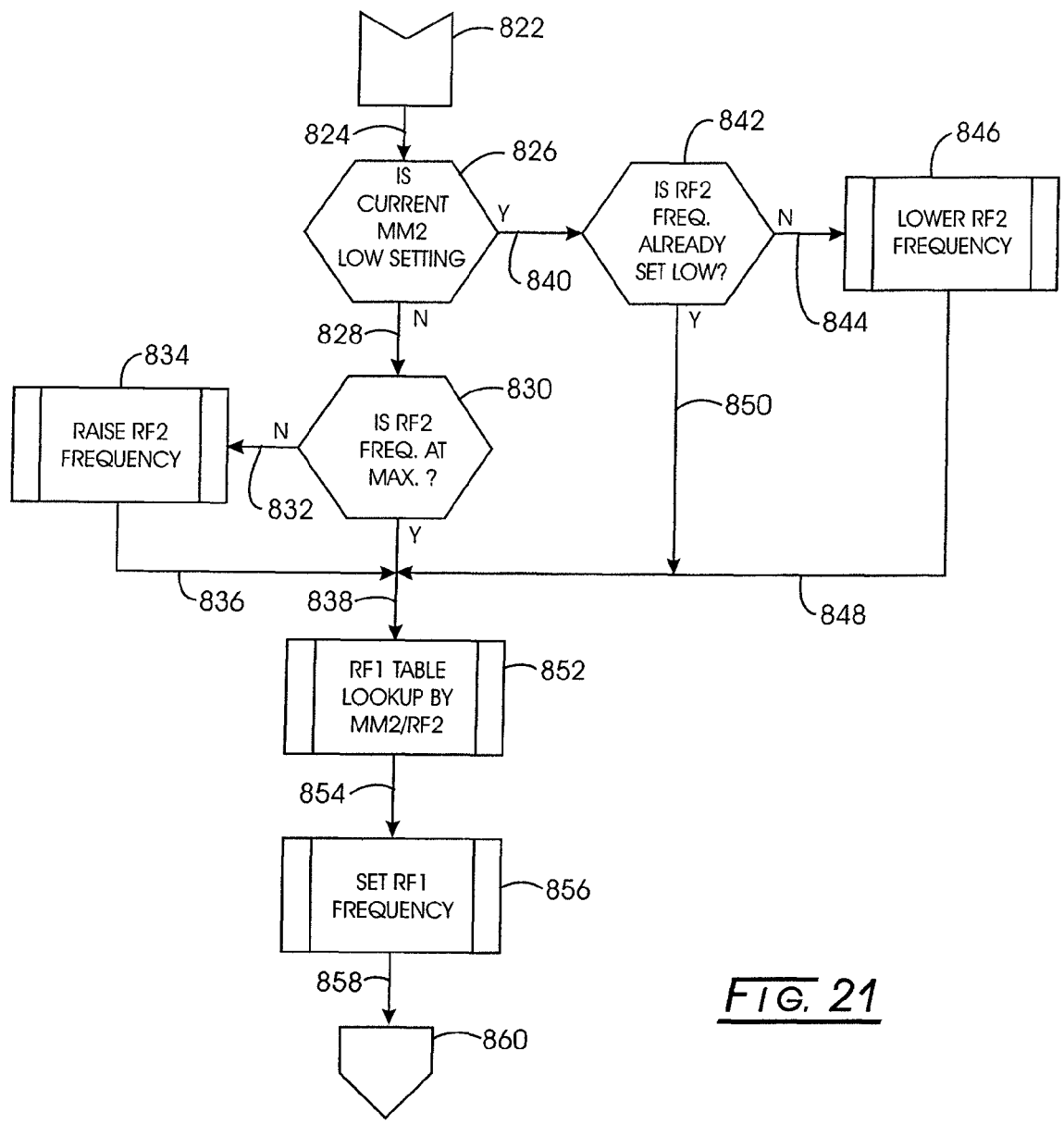
FIG. 21 is a block diagram of an arc proximity computation approach described in connection with FIG. 20.

Next, as represented at arrow 812 and block 814, the recording control function is carried out in the manner described in connection with block 642 of FIG. 13 and as described in more detail in FIG. 18. Where the maintenance merit resultants are above a setpoint, they are correlated with Greenwich mean time, GPS location, temperature, humidity and pressure and recordation is started as represented at arrow 816. Next, arc proximity computation is carried out as represented at arrow 820 and block 734. For the instant embodiment utilizing radio no. 1 and radio no. 2, the arc proximity computation is somewhat altered, initially looking to an analysis of the low frequency parameter maintenance merit, MM2 and then doing a table look-up to set the high frequency radio no. 1 frequency. Referring to FIG. 21, this altered approach is diagramed in detail. In the figure, this feature is approached as represented at symbol 822 and arrow 824 which is directed to the query posed at symbol 826 determining whether maintenance merit MM2 (low frequency) is less than a low setting. In the event that it is not less than a low setting, then as represented at arrow 828 and symbol 830, a determination is made as to whether radio no. 2 frequency is at a maximum level. In the event that it is not, then as represented at arrow 832 and block 834, the frequency setting at radio no. 2 is raised and the program continues as represented at arrow 836. If the adjustment of radio no. 2, (block 724) is at a maximum setting, then the program continues as represented at block 838.

Returning to symbol 826 where the current maintenance merit (MM2) is less than the low setting, then as represented at arrow 840 and symbol 842, a query is posed as to whether radio no. 2 (RF2) frequency already has been set at a low level. In the event that it has not, then as represented at arrow 844 and block 846, the radio no. 2 (RF2) frequency setting is lowered and the program continues as represented at arrow 848 which extends to arrow 838. Returning to symbol 842, where the radio no. 2 frequency setting is already at a low level, then as represented at arrows 850, 848 and 838, the program continues.

Arrow 838 is directed to block 852 which indicates that the wideband radio frequency response ranges of the first computer controllable radio receiver are retained in a look-up table addressable by a combination of the second low frequency parameter maintenance merit values and second wideband radiofrequency response. Upon carrying out such look-up, as represented at arrow 854 and block 856, the radio frequency of radio no. 1 is set and the program continues as represented at arrow 858 and symbol 860 to reenter this dual program at blocks 784 and 788 as discussed in connection with FIG. 20.

Another approach to the instant system involves the features of FIG. 13 and system 10 as they are enhanced with a failure signature library performing in conjunction with a signature correlation and selection filter. In this regard, it may be recalled from FIG. 10 that new signatures were delivered to a failure signature library from the cellular modem function. Looking to FIG. 22, this system enhancement is represented generally at 870. In the figure, a wideband antenna 872 is shown in operative association with a computer controllable radio receiver represented at block 874. Such computer control is over radio function 874 is represented at arrow 876. The amplitude detected output (0-6 kHz) from radio facility 874 is represented at arrow 878 which is directed to analog-to-digital conversion as represented at block 880. Sample rate control for the conversion function 880 is represented by arrow 882. Also carried out is a set up of parameters as represented at symbol 884, such set up applying to all blocks of the diagram as represented at arrow 886. Returning to the conversion function 880, digital samples are produced as represented at arrow 888 to provide digital data from the radio function 874 as represented at symbol 890. Arrow 892 represents that such digital data is available to raw data storage as represented at symbol 894.

Returning to symbol 890, as represented at arrow 896 and block 898, digital signal processor is provided which is configured for carrying out arc detection and analysis including fast Fourier transforms (FFT) of the digital samples, extracting narrowband signal frequencies (bins) therefrom that are harmonically related to the fundamental frequency of the network.

Figure 22:
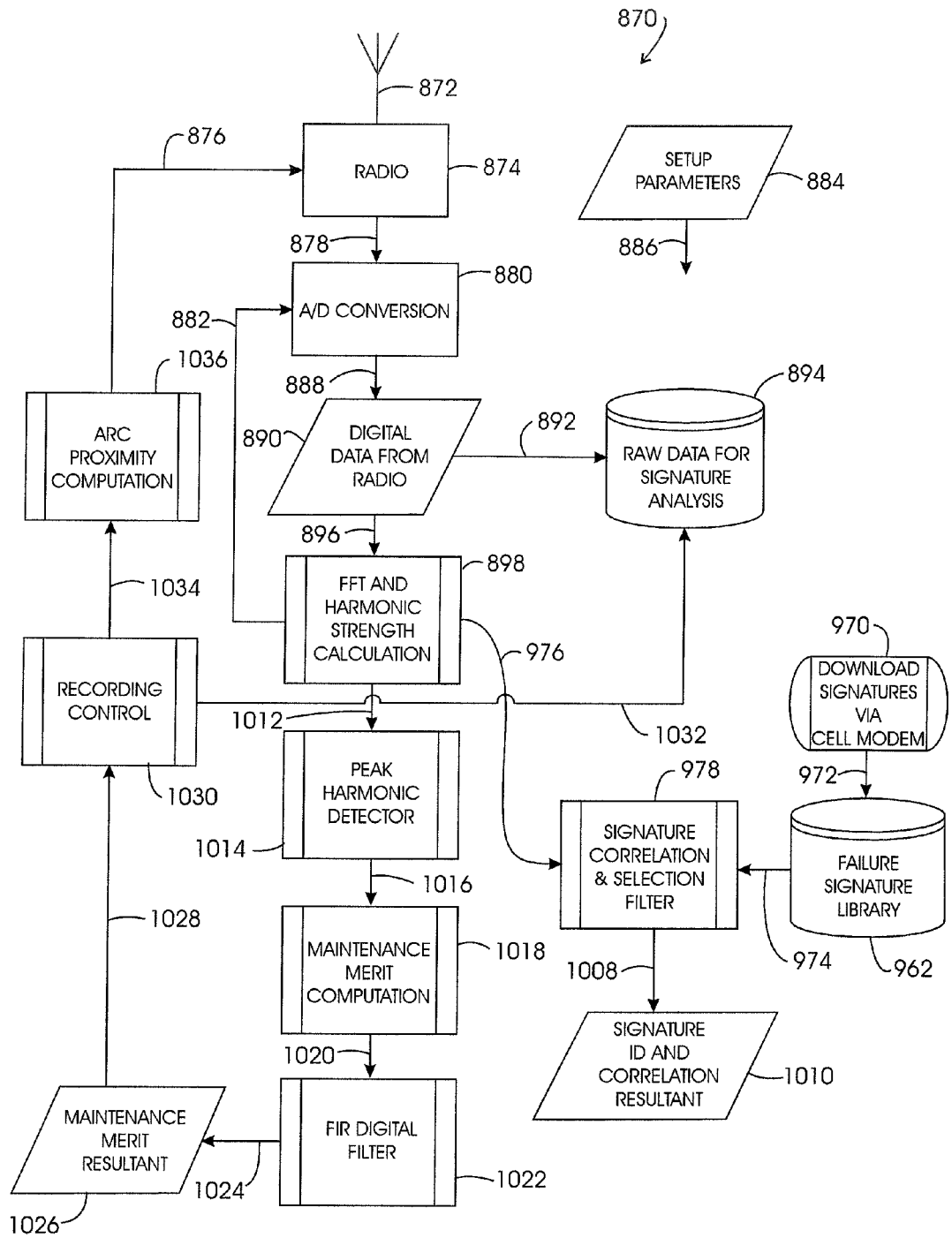
FIG. 22 is a software block diagram of a single radio with signature analysis embodiment of the instant system.
Figure 23:
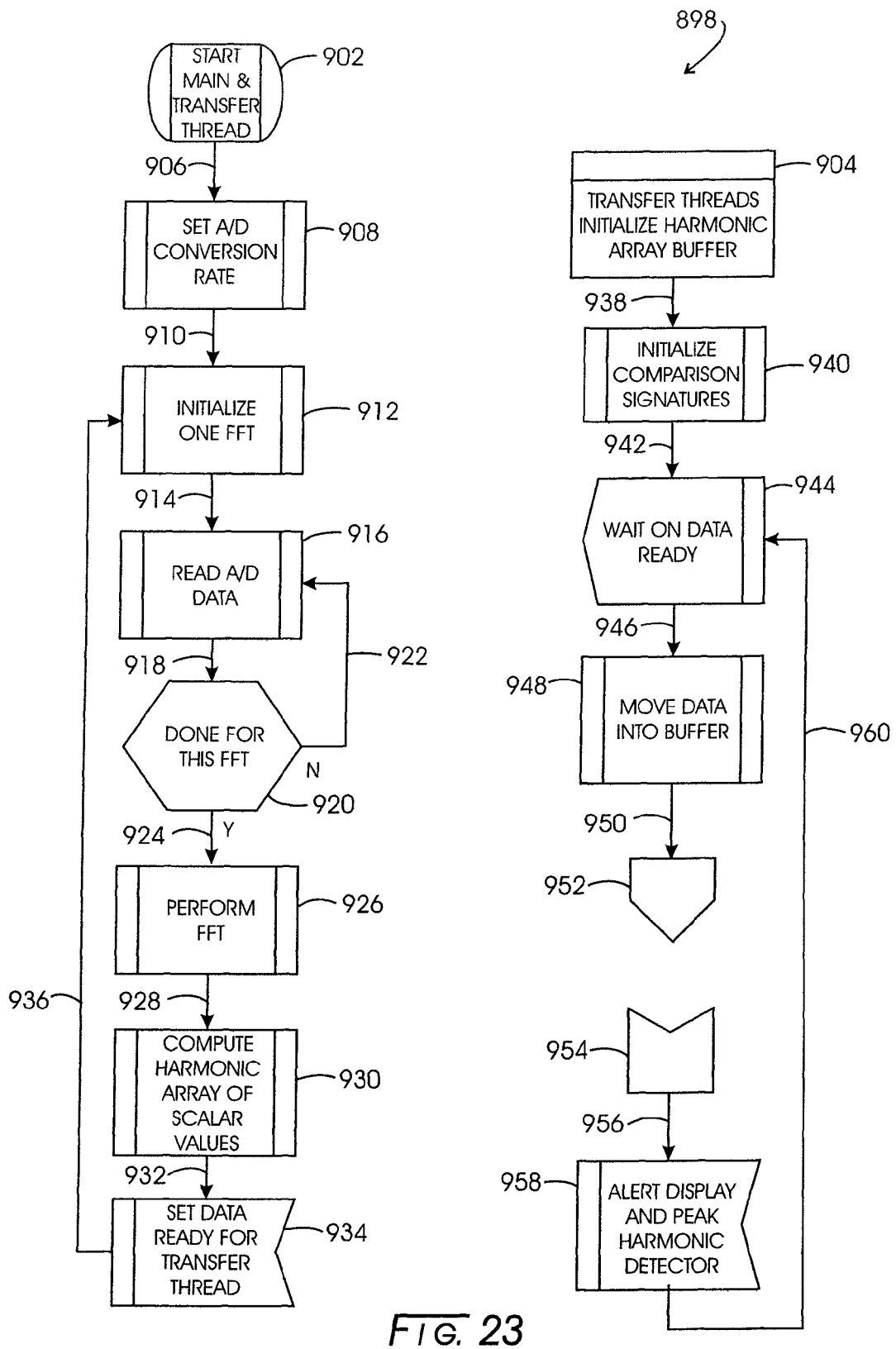
FIG. 23 is a block diagram of an FFT, harmonic strength and correlation calculation described in connection with FIG. 22.

Referring to FIG. 23, the function of block 898 is revealed at an enhanced level of detail. Starting of the main software thread is represented at symbol 902, while the transfer thread function carries out an initialization of the harmonic array buffer as represented at block 904. From symbol 902, an arrow 906 extends to block 908 providing for setting the analog-to-digital conversion rates a function represented in FIG. 22 at arrow 882. Next, as represented at arrow 910 and block 912, one FFT is initialized and, as represented at arrow 914 and block 916, the digital sample based A/D data is read. As represented at arrow 918, symbol 920 and loop arrow 922, such reading continues until the digital sample collection is completed whereupon, as represented at arrow 924 and block 926, the fast Fourier transform (FFT) is performed. Upon completion of the FFT, as represented at arrow 928 and block 930, the system computes a harmonic array of scalar values in the manner described in connection with FIG. 14 and block 498. Upon such computation, as represented at arrow 932 and symbol 934, data ready is set for the transfer thread and, as represented at return arrow 936, the program reverts to block 912.

Returning to block 904, as represented at arrow 938 and block 940, for the instant embodiment, comparison signatures are initialized and as represented at arrow 942 and symbol 944, the system transfer thread awaits a data ready input whereupon, as represented at arrow 946 and block 948, data is moved into a buffer and as represented at arrow 950 and symbol 952, the system will communicate with a signature correlation and selection filter shown in FIG. 22. As represented at symbol 954, arrow 956 and symbol 958, a display and peak harmonic detector is alerted and the thread loops as represented by loop arrow 960 to symbol 944 awaiting another data ready input.

Figure 24:
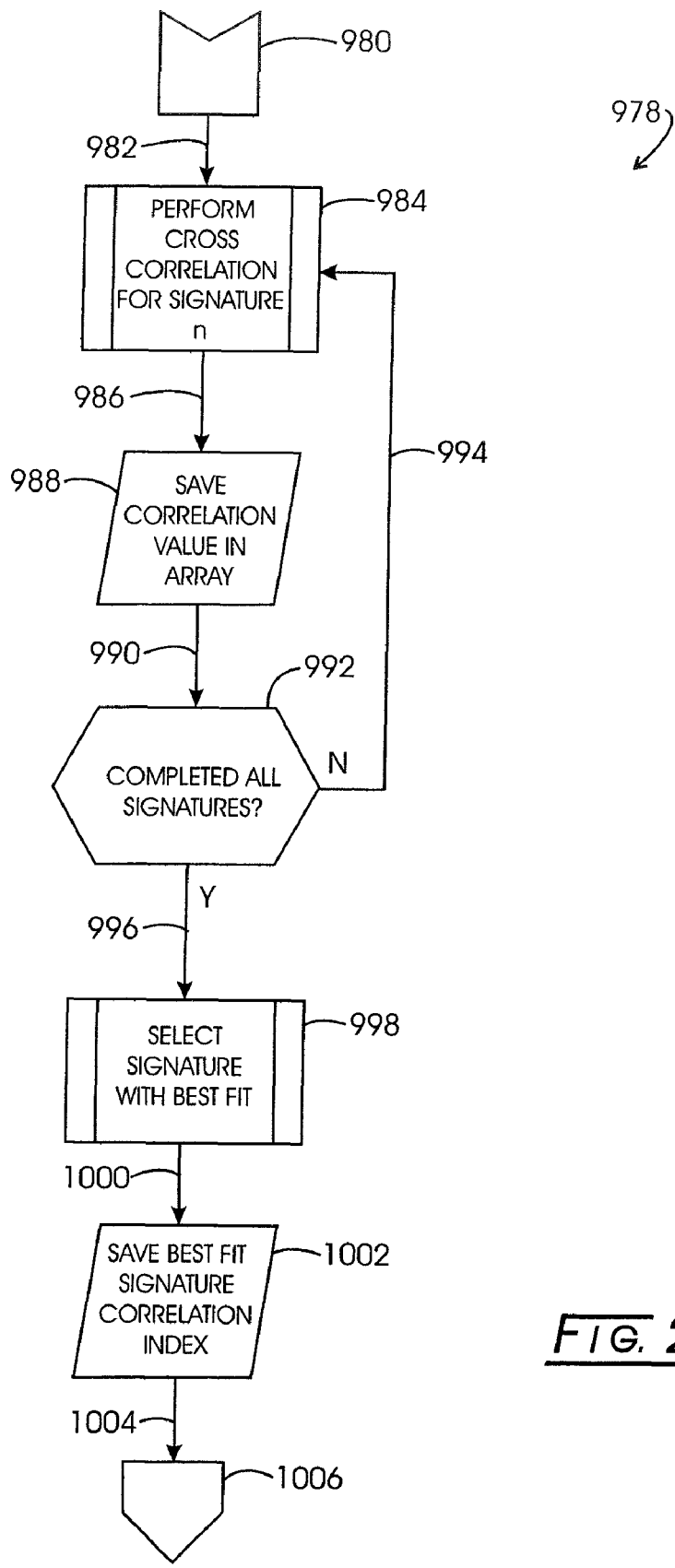
FIG. 24 is a block diagram of a signature correlation and selection filter described in connection with FIG. 22.

Returning to FIG. 22, the failure signature library for this enhancement is represented at symbol 962. It may be recalled from FIG. 10 that these signatures are uploaded, inter alia, to this library from the cellular modem function 296. Accordingly, in FIG. 22, downloading is represented at symbol 970 and arrow 972. Failure signature library 962 receives and stores analyzed arc data including the earlier-discussed fast Fourier transforms of the digital samples including the extracted narrowband signal frequencies (bins) that are harmonically related to the fundamental frequency, the peak amplitudes of the analysis, a radio frequency spectrum of the analysis, an accept/reject signature event indicator, a signature part type, a signature part number, and a manufacturer. As represented by arrows 974, 976 and block 978, a signature correlation and selection filter is controlled to correlate the failure signature library retained arc data with the carrying out of arc detection and analysis prior to the analysis for peak amplitudes as discussed in connection with block 898. It may be recalled from FIG. 23 that comparison signatures were initialized as described at block 940. Looking to FIG. 24, correlation and selection as described at block 978 are further discussed at an enhanced level of detail. The filter is entered as represented at symbol 980 and arrow 982, leading to block 984 wherein cross correlation is carried out for signatures identified with the index, n. As represented at arrow 986 and symbol 988, a correlation value is saved and, as represented at arrow 990 and symbol 992, a query is posed as to whether all signals have been examined. In the event they have not, then as represented at looping arrow 994, the procedure is reiterated. Where all signals have been examined, then as represented at arrow 996 and block 998, the procedure selects the signature with a best fit. And, as represented at arrow 1000 and symbol 1002, the best fit signature correlation index is saved and made available as represented in FIG. 22 at arrow 1008 and symbol 1010. The signature ID and correlation resultant are saved with maintenance merit data for uploading as discussed in connection with FIG. 10.

Returning to block 898 and associated arrow 1012, the program then carries out peak harmonic detection as represented at block 1014. This feature has been discussed at a higher level of detail in connection with FIG. 15. Next, as represented at arrow 1016 and block 1018, maintenance merit computation is carried out as described in detail in FIG. 16. The maintenance merit values then, as represented at arrow 1020 and block 1022 are subjected to finite impulse response filtering as represented at arrow 1020 and block 1022. The result of such filtering is represented at arrow 1024 and symbol 1026 as a maintenance merit resultant which has been described in detail in connection with FIG. 17. The program then proceeds as represented at arrow 1028 and block 1030 to recording control which, as represented at arrow 1032 enables the storage of raw data for signal signature analysis as represented at symbol 894. Additionally, the recording control function at block 1030 carries out the features represented in FIG. 18, whereupon the program proceeds as represented at arrow 1034 and block 1036 providing for the carrying out of arc proximity computation and associated adjustments of the frequency response of radio 874 as discussed in connection with FIG. 19.

Since certain changes may be made in the above apparatus and method without departing from the scope of the disclosure herein involved, it is intended that all matter contained in the above description or shown in the accompanying drawings shall be interpreted as illustrative and not in a limiting sense.

We claim:

1. A method for detecting and generally locating arcing at a component of an electrical power distribution or transmission system, said system by means of radio frequency emissions, exhibiting a fundamental a.c. frequency and located within a given geographic region, comprising the steps:

providing a mobile receiving assemblage including a wideband antenna, a computer controllable wideband radio receiver capable of receiving said radio frequency emissions having an audio output, and a global positioning system (GPS) receiver providing position data;

maneuvering said receiving assemblage about said geographic region;

converting said audio output to digital form at a sampling rate to provide digital samples;

providing a control assemblage including a digital signal processor, a control computer, a fast Fourier transform (FFT) function and a storage function;

responding to said digital samples with said FFT function of said control assemblage to derive narrow band signal values that are harmonically related to said fundamental a.c. frequency; and further with said control assemblage, detecting said signal values and classifying them according to arc strength to provide classified signal values, controlling said wideband radio receiver with respect to its detection range, deriving values of maintenance merit from said classified signal values, correlating said values of maintenance merit when greater than a set point, with position data from said GPS receiver to provide position associated maintenance merit values and submitting them to said storage function, further with said control assemblage control computer, comparing a said maintenance merit value with a low setting, when such maintenance merit value is less than such low setting, then when radio receive frequency charge capability is available, said control computer effecting a lowering of the wideband radio receive frequency of said radio receiver, said control computer being responsive when such maintenance merit value is greater than said low setting to effect, when radio receiver frequency change capability is available, a raising of the wideband radio receive frequency of said radio receiver.

2. The method of claim 1 in which:

said control assemblage is maneuverable with said receiving assemblage.

3. A system for detecting and generally locating an arcing phenomenon within an electrical power distribution or transmission system which exhibits wideband radio frequency emission with a varying amplitude said varying amplitude changing at the electrical power distribution system fundamental a.c. frequency and its harmonics and said phenomenon being located within a given geographic region, comprising:

a mobile receiving assemblage including a wideband antenna, a computer controllable wideband radio receiver operatively coupled with said wideband antenna and having an amplitude detected output, and a global positioning system (GPS) receiver providing GPS position data;

an analog-to-digital (A/D) converter responsive to said amplitude detected output to convert it to digital form at a sampling rate to provide digital samples;

a digital signal processor (DSP) configured for carrying out arc detection and analysis including fast Fourier transforms (FFT) of said digital samples, extracting narrow band signal frequencies therefrom that are harmonically related to said fundamental frequency, analyzing said harmonically related narrow band frequencies for peak amplitudes and summing such peak amplitudes to derive maintenance merit values; and a control computer including a digital storage facility, radio receive frequency change capability, said control computer being responsive to control said radio receiver to locate said amplitude detected output, said control being responsive to compare a said maintenance merit value with a low setting, when such maintenance merit value is less than such low setting, then when radio receive frequency change capability is available said control computer effecting a lowering of the wideband radio receive frequency of said radio receiver, said control computer being responsive when such maintenance merit value is greater than said low setting to effect, when radio receiver frequency change capability is available, a raising of the wideband radio receive frequency of said radio receiver, said control computer further being responsive to compile said maintenance merit values with said GPS position data, and submit such compiled data to the storage facility.

4. The system of claim 3 in which:

said analog-to-digital converter, said digital signal processor, said control computer and said radio receiver are mounted within a portable housing.

5. The system of claim 4 in which:

said portable housing is located within a vehicle maneuverable about said geographic region, said wideband antenna and GPS receiver being mountable with said vehicle.

6. The system of claim 5 further comprising:

an arc data storage server configured to receive said compiled merit value and GPS position data from a cell phone network; and a cellular modem within said housing controllable by said control computer to broadcast said compiled merit values and position data to said arc data storage server.

7. The system of claim 6 in which said system further comprises:

a display facility in data transfer communication with said arc data storage server and configured to display a map of said geographic region in combination with visible indicia representing said compiled merit values and GPS position data and also displays GPS track information indicating geographical coverage by the mobile system.

8. The system of claim 5 in which:

said vehicle includes a storage battery electrical power supply and an ignition switch actuateable between on and off orientations to selectively activate a switched electrical power supply;

said system further comprising a power supply circuit under the control of said control computer, said power supply circuit being responsive to actuation of the ignition switch to the on-orientation to power all components of said system from the switched electrical power supply and said power supply circuit being controllable in response to actuation of said ignition switch to the off-orientation to effect the powering of the vehicle borne components of said system from the storage battery electrical power supply for an interval effective to broadcast said compiled merit value and position data.

9. The system of claim 3 in which:

said digital signal processor is further configured to carry out a finite impulse response filtering of said maintenance merit values to provide resultant maintenance merit values for said compilation with GPS position data.

10. The system of claim 9 in which:

said control computer is responsive to a said resultant merit value when it exceeds a setpoint value and is derived in the presence of said fundamental frequency or a harmonic thereof to submit said compiled data to the storage facility.

11. The system of claim 3 in which said system further comprises:

a weather sensing assemblage having a weather output representing ambient temperature, humidity and barometric pressure; and said control computer is responsive to submit said weather output to said storage facility in conjunction with the submittal of said compiled merit values and GPS position data.

12. The system of claim 3 in which:

said control computer sets said analog-to-digital converter sample length to a mathematical power of 2 and sample rate such that said fast Fourier transforms exhibit an output with said narrow band frequencies falling on said fundamental frequency and its harmonics.

13. The system of claim 3 in which:

said control computer is responsive to submit said digital samples as raw data to the storage facility to develop a signature analysis capability.

14. The system of claim 3 further comprising:

an arc data storage server configured to receive said compiled data from a cell phone network; and a cellular modem within said housing controllable by said control computer to broadcast said compiled data to said arc data storage server.

15. The system of claim 14 further comprising:

a display facility in data transfer communication with said arc data storage server and configured to display a map of said geographic region in combination with visible indicia representing said compiled data.

16. The system of claim 3 in which:

said control computer sets the sample length of said first and second analog-to-digital converters to derive a fast Fourier transform sequence length which is a mathematical power of 2 and said fast Fourier transforms of said first and second digital signal processors exhibit outputs with said narrow band frequencies falling on said fundamental and its harmonics.

17. A system for detecting and generally locating an arcing phenomena within an electrical power distribution or transmission system which exhibits wideband radio frequency emissions with a varying amplitude changing at the electrical power distribution system fundamental a.c. frequency and its harmonics and located within a given geographic region, comprising:

a mobile receiving assemblage including at least one wideband antenna, at least one computer controllable wideband radio receiver operatively coupled with said wideband antenna and having an amplitude detected output, and a global positioning system (GPS) receiver providing GPS position data;

an analog-to-digital (A/D) converter responsive to said amplitude detected output to convert said amplitude detected output to digital form at a sampling rate to provide digital samples;

a digital signal processor (DSP) configured for carrying out arc detection and analysis including fast Fourier transforms (FFT) of said digital samples extracting narrow band signal frequencies from said fast Fourier transforms that are harmonically related to said fundamental frequency, and analyzing said harmonically related narrow band frequencies for peak amplitudes, and summing such peak amplitudes to derive maintenance merit values;

a failure signature library having an input for receiving detected and analyzed arc data including said fast Fourier transforms of said digital samples, extracted narrow band signal frequencies that are harmonically related to said fundamental frequency, the peak amplitudes of a said fast Fourier transform analysis extracting narrow band signal frequencies, a radio frequency spectrum of a said analysis, an accept/reject signature event indicator, a signature part type, a signature part number and a manufacturer;

a signature correlation and selection filter controllable to correlate said failure signature library retained arc data with the said carrying out of arc detection and analysis prior to said analysis for peak amplitudes; and a control computer including a digital storage facility and said control computer being responsive to control said radio receiver to locate said amplitude detected output, said control computer being responsive to compare a said maintenance merit value with a low setting, when such maintenance merit value is less than such low setting then when radio receive frequency change capability is available said control computer effecting a lowering of the wideband radio receive frequency of said radio receiver, said control computer being responsive when such maintenance merit value is greater than said low setting to effect, when radio receiver frequency change capability is available, a raising of the wideband radio receive frequency of said radio receiver, said control computer further being responsive to control said signature correlation and selection filter to an extent effective to enhance the derivation of maintenance merit values, to reject known false signature indications and further responsive to compile said maintenance merit values signature correlation data with said GPS position data, and submit such compiled data to the storage facility.

18. The system of claim 17 in which:
said analog-to-digital converter, said digital signal processor, said control computer and said radio receiver are mounted within a portable housing.

19. The system of claim 18 in which:
said portable housing is located within a vehicle maneuverable about said geographic region, said wideband antenna and GPS receiver being mountable with said vehicle.

20. The system of claim 19 further comprising:
an arc data storage server configured to receive said compiled merit value and GPS position data from a cell phone network; and a cellular modem within said housing controllable by said control computer to broadcast said compiled merit values and position data to said arc data storage server.

21. The system of claim 20 in which said cellular modem and said failure signature library are controlled by said control computer to download said detected and analyzed arc data to said failure signature library input.

22. The system of claim 20 in which said system further comprises:
a display facility in data transfer communication with said arc data storage server and configured to display a map of said geographic region in combination with visible indicia representing said compiled merit values and GPS position data.

23. The system of claim 19 in which:
said vehicle includes a storage battery electrical power supply and an ignition switch actuateable between on and off orientations to selectively activate a switched electrical power supply;

said system further comprising a power supply circuit under the control of said control computer said power supply circuit being responsive to actuation of the ignition switch to the on-orientation to power all components of said system from the switched electrical power supply and said power supply circuit being controllable in response to actuation of said ignition switch to the off-orientation to effect the powering of the vehicle borne components of said system from the storage battery electrical power supply for an interval effective to broadcast said compiled merit value and position data.

24. The system of claim 17 in which:
said digital signal processor is further configured to carry out a finite impulse response filtering of said maintenance merit values to provide resultant maintenance merit values for said compilation with GPS position data.

25. The system of claim 24 in which:
said control computer is responsive to a said resultant merit value when it exceeds a setpoint value and is derived in the presence of said fundamental frequency or a harmonic thereof to submit said compiled data to the storage facility.

26. The system of claim 17 in which said system further comprises:
a weather sensing assemblage having a weather output representing ambient temperature, humidity and barometric pressure; and said control computer is responsive to submit said weather output to said storage facility in conjunction with the submittal of said compiled merit values and GPS position data.

27. The system of claim 17 in which:
said control computer sets said analog-to-digital converter sample length to a mathematical power of 2 and sample rate such that said fast Fourier transforms exhibit an output with said narrow band frequencies falling on said fundamental frequency and its harmonics.

28. The system of claim 17 in which:
said control computer is responsive to submit said digital samples as raw data to the storage facility to develop a signature analysis capability.

* * * * *